(12) United States Patent
Amano et al.

(10) Patent No.: US 12,087,724 B2
(45) Date of Patent: Sep. 10, 2024

(54) PALLADIUM-COATED COPPER BONDING WIRE AND METHOD FOR MANUFACTURING SAME

(71) Applicant: TANAKA DENSHI KOGYO K. K., Saga (JP)

(72) Inventors: Hiroyuki Amano, Saga (JP); Yuki Antoku, Saga (JP); Takeshi Kuwahara, Saga (JP)

(73) Assignee: TANAKA DENSHI KOGYO K. K., Kanzaki-gun (JP)

( * ) Notice: Subject to any disclaimer, the term of this patent is extended or adjusted under 35 U.S.C. 154(b) by 577 days.

(21) Appl. No.: 17/328,622

(22) Filed: May 24, 2021

(65) Prior Publication Data
US 2021/0280553 A1    Sep. 9, 2021

Related U.S. Application Data

(63) Continuation of application No. PCT/JP2018/044294, filed on Nov. 30, 2018.

(30) Foreign Application Priority Data

Nov. 26, 2018 (JP) ................................. 2018-220570

(51) Int. Cl.
H01L 23/00 (2006.01)
(52) U.S. Cl.
CPC .............. *H01L 24/45* (2013.01); *H01L 24/43* (2013.01); *H01L 24/05* (2013.01); *H01L 24/48* (2013.01);
(Continued)
(58) Field of Classification Search
CPC ......... H01L 24/45; H01L 24/43; H01L 24/05; H01L 24/48; H01L 24/85;
(Continued)

(56) References Cited

U.S. PATENT DOCUMENTS

2017/0117244 A1    4/2017    Yamada et al.
2017/0125135 A1    5/2017    Amano et al.
(Continued)

FOREIGN PATENT DOCUMENTS

CN    106415830 A    2/2017
JP    2012-156307 A    8/2012
(Continued)

OTHER PUBLICATIONS

MY, Office Action for Malayasian application No. PI2021002812, Aug. 12, 2022.
(Continued)

*Primary Examiner* — Mohammad A Rahman
(74) *Attorney, Agent, or Firm* — ORRICK, HERRINGTON & SUTCLIFFE LLP; K. Patrick Herman; Richard Martinelli

(57) ABSTRACT

There is provided a palladium-coated copper bonding wire that does not cause a shrinkage cavity during first bonding, has high bonding reliability, and is capable of maintaining excellent bonding reliability for a long period of time even in high-temperature and high-humidity environments. A palladium-coated copper bonding wire in which a concentration of palladium is 1.0 mass % or more and 4.0 mass % or less relative to the total of copper, palladium, and a sulfur group element, a total concentration of the sulfur group element is 50 mass ppm or less, and a concentration of sulfur is 5 mass ppm or more and 12 mass ppm or less, a concentration of selenium is 5 mass ppm or more and 20 mass ppm or less, or a concentration of tellurium is 15 mass ppm or more and 50 mass ppm or less, and the palladium-coated copper bonding wire including a palladium-concentrated region with the average concentration of palladium of 6.5 atom % or more and 30.0 atom % or less relative to the total of copper and palladium within a range from a surface (Continued)

of a tip portion of a free air ball formed at a tip of the wire to 5.0 nm or more and 100.0 nm or less.

12 Claims, 4 Drawing Sheets

(52) U.S. Cl.
CPC .... *H01L 24/85* (2013.01); *H01L 2224/05624* (2013.01); *H01L 2224/43825* (2013.01); *H01L 2224/43826* (2013.01); *H01L 2224/43827* (2013.01); *H01L 2224/45005* (2013.01); *H01L 2224/45101* (2013.01); *H01L 2224/45117* (2013.01); *H01L 2224/45147* (2013.01); *H01L 2224/45565* (2013.01); *H01L 2224/45572* (2013.01); *H01L 2224/45601* (2013.01); *H01L 2224/45617* (2013.01); *H01L 2224/45644* (2013.01); *H01L 2224/45664* (2013.01); *H01L 2224/48175* (2013.01); *H01L 2224/48463* (2013.01); *H01L 2224/85045* (2013.01); *H01L 2924/01016* (2013.01); *H01L 2924/01034* (2013.01); *H01L 2924/01052* (2013.01)

(58) Field of Classification Search
CPC . H01L 2224/05624; H01L 2224/43825; H01L 2224/43826; H01L 2224/43827; H01L 2224/45005; H01L 2224/45101; H01L 2224/45117; H01L 2224/45147; H01L 2224/45565; H01L 2224/45572; H01L 2224/45601; H01L 2224/45617; H01L 2224/45644; H01L 2224/45664; H01L 2224/48175; H01L 2224/48463; H01L 2224/85045; H01L 2924/01016; H01L 2924/01034; H01L 2924/01052; H01L 24/06; H01L 24/49; H01L 24/78; H01L 2224/04042; H01L 2224/05554; H01L 2224/06135; H01L 2224/43848; H01L 2224/45015; H01L 2224/45144; H01L 2224/78318; H01L 2224/85205; H01L 2224/49171; H01L 2224/85203; H01L 2224/85439; H01L 2224/85444; H01L 2924/10253; H01L 2924/14; H01L 2224/48247; H01L 24/42; H01L 2224/45032; H01L 2224/48799; H01L 21/60; C22C 9/00; C22C 9/06

See application file for complete search history.

(56) References Cited

U.S. PATENT DOCUMENTS

| | | | |
|---|---|---|---|
| 2017/0216974 | A1 | 8/2017 | Yamada et al. |
| 2018/0130763 | A1 | 5/2018 | Yamada et al. |
| 2019/0287875 | A1* | 9/2019 | Koerner .............. H01L 23/4952 |

FOREIGN PATENT DOCUMENTS

| | | | |
|---|---|---|---|
| JP | 2017-092078 | A | 5/2017 |
| JP | 2018-078229 | A | 5/2018 |
| JP | 2018-137487 | A | 8/2018 |
| TW | 201643261 | A | 12/2016 |
| TW | 201704488 | A | 2/2017 |
| TW | 201716592 | A | 5/2017 |
| WO | WO 2016/189758 | A1 | 12/2016 |

OTHER PUBLICATIONS

TW, Office Action for Taiwanese application No. 107143373, Nov. 19, 2021.
PCT, International Search Report for PCT/JP2018/044294 Jan. 8, 2019.

* cited by examiner

Depth (nm) (in terms of SiO$_2$)

Depth Direction Analysis Result (Example 3)

PALLADIUM-COATED COPPER BONDING WIRE AND METHOD FOR MANUFACTURING SAME

CROSS REFERENCE TO RELATED APPLICATION

This application is a continuation of International Application No. PCT/JP2018/044294, filed Nov. 30, 2018, which is based upon and claims the benefit of priority from Japanese Patent Application No. 2018-220570, filed on Nov. 26, 2018; the entire contents of which are incorporated herein by reference.

BACKGROUND

Field

Embodiments herein relate to a palladium-coated copper bonding wire suitable for ball bonding of an electrode of a semiconductor element and an external electrode and a method of manufacturing thereof.

Related Art

In general, an electrode of a semiconductor element and an external electrode on a circuit wiring board for semiconductors are connected by wire bonding. In this wire bonding, the electrode of the semiconductor element and one end of a bonding wire are bonded by a method called ball bonding (first bonding), and the other end of the bonding wire and the external electrode are bonded by a method called wedge bonding (second bonding). In the ball bonding, a molten ball is formed at a tip of the bonding wire, and the bonding wire is connected to a surface of an aluminum electrode on the semiconductor element via the molten ball, for example.

When forming the molten ball, the tip of the bonding wire is first held vertically, an arc discharge is formed between the tip and a discharge torch using the Electronic Flame-Off (EFO) method, and by a discharge current, heat input is applied to the tip of the wire. By this heat input, the tip of the bonding wire is heated to melt. A molten metal rises through the wire due to its surface tension, and a spherical molten ball is formed at the tip of the wire to solidify, and thereby a free air ball (FAB) is formed. Then, the free air ball is crimped onto the electrode with ultrasonic waves being applied thereto while heating the electrode of the semiconductor element to about 140-300° C., and thereby one end of the bonding wire is bonded onto the aluminum electrode.

A gold wire with a diameter of 10-30 μm has been used for the wire bonding, but due to gold being very expensive, a copper wire has been used in a replaceable portion partly. However, the copper wire has a problem of being oxidized easily, so that a palladium-coated copper wire with a palladium-coated surface has come to be used to solve the oxidation problem.

However, the palladium-coated copper wire has an issue of achieving both the stability of bonding to the aluminum electrode and the loop stability because the surface of the ball is oxidized, for example. In response to this, for example, there has been proposed a palladium-coated copper wire containing sulfur in a copper core material.

Although the palladium-coated copper wire suffers from the problem of oxidation of wires or free air balls inherent in copper itself, as well as the problem of improving the properties that tend to be impaired by coating, copper is less expensive than gold and thus has rapidly become popular for use under relatively moderate conditions in consumer devices such as personal computers, peripheral devices, and communications devices, and so on. Furthermore, in recent years, improvements of the palladium-coated copper wire have been in progress, and a shift of bonding wires, which are used under severe conditions, such as in devices for automobile use, to the palladium-coated copper wire has been in progress as well. As a result, the palladium-coated copper wire is required to be able to withstand extremely severe and rapidly changing conditions to be suitable for the devices for automobile use. Concretely, the palladium-coated copper wire is required to withstand a wide range of natural environments and their changes, from high-temperature and high-humidity regions such as the tropics and deserts to cold regions, and from mountainous regions to coastal regions, as well as to withstand shocks and vibrations caused by road and traffic conditions. In addition, in recent years, the application to semiconductor products to be installed in aircraft as well as in an engine compartment of automobiles has come under consideration. As a result, there is a need for the palladium-coated copper bonding wire that meets the requirements of higher levels of reliability than ever before, which can withstand relatively moderate conditions of consumer applications as well as severe conditions.

In the process of developing the palladium-coated copper wire that meets such requirements for high reliability, attempts have been made to improve the bonding life by forming an alloy layer or a concentrated layer with a high concentration of palladium on the surface of the free air ball.

SUMMARY

However, although increasing the concentration of palladium of the surface of the free air ball has improved the bonding life as compared to a conventional wire (wire whose concentration of palladium is not increased) used in applications in relatively moderate conditions, it has been found out that the bonding life does not often extend as much when aiming for use in severe conditions. The present inventors observed a large shrinkage cavity formed in the surface of the free air ball in such a palladium-coated copper wire whose bonding life did not extend, and thus presumed that this would be a factor inhibiting the extension of the bonding life. That is, they considered that when the free air ball having a shrinkage cavity was bonded onto the aluminum electrode, a void would be formed at the bonding interface, and this void served as a starting point for corrosion to progress, resulting in a decrease in the bonding life.

As a result of the intensive investigation into the cause of this problem, the present inventors concluded that some of the gold or silver plated on the surface of the external electrode adhered to an end portion of the wire that was torn off after the second bonding, and this gold or silver served as a starting point to form a shrinkage cavity in the free air ball.

The embodiments have been made in order to solve the above-described problems, and an object thereof is to provide a palladium-coated copper bonding wire that does not cause a problematic large shrinkage cavity to be formed in a surface of a ball during ball formation and is capable of maintaining bonding reliability of ball bonding even in high-temperature and high-humidity environments.

Further, an object of the embodiments is to provide a manufacturing method of a palladium-coated copper bonding wire capable of maintaining high bonding reliability even in high-temperature and high-humidity environments.

The palladium-coated copper bonding wire of the embodiment is a palladium-coated copper bonding wire including: a core material containing copper as a main component; and a palladium layer on the core material, and containing a sulfur group element, in which a concentration of palladium is 1.0 mass % or more and 4.0 mass % or less relative to the total of copper, palladium, and the sulfur group element of the palladium-coated copper bonding wire, and a total concentration of the sulfur group element is 50 mass ppm or less, a concentration of sulfur (S) is 5 mass ppm or more and 12 mass ppm or less, a concentration of selenium (Se) is 5 mass ppm or more and 20 mass ppm or less, or a concentration of tellurium (Te) is 15 mass ppm or more and 50 mass ppm or less, and the palladium-coated copper bonding wire includes a palladium-concentrated region with the average concentration of palladium of 6.5 atom % or more and 30.0 atom % or less relative to the total of copper and palladium within a range from a surface of a tip portion of a free air ball formed at a tip of the wire to 5.0 nm or more and 100.0 nm or less.

In the palladium-coated copper bonding wire of the embodiment, when the free air ball is formed at the wire having the above-described composition, the palladium-concentrated region having the above-described composition can be formed in the surface of the tip portion, and thereby it is possible to improve bonding reliability of first bonding and suppress occurrence of a shrinkage cavity in the free air ball simultaneously.

In the palladium-coated copper bonding wire of the embodiment, a concentration of palladium derived from the palladium layer is preferably 1.0 mass % or more and 2.5 mass % or less relative to the total of copper, palladium, and the sulfur group element.

In the palladium-coated copper bonding wire of the embodiment, when the concentration of palladium derived from the palladium layer is in the above-described range in particular, the palladium-concentrated region having the above-described composition is formed easily, and thus, it makes it easier to achieve both the improvement in the bonding reliability of the first bonding and the suppression of the occurrence of a shrinkage cavity in the free air ball.

In the palladium-coated copper bonding wire of the embodiment, free air ball forming conditions are preferably that a discharge current value is 65 mA and a diameter of a ball is 1.8 times the diameter of the wire, in the presence of a mixed gas of nitrogen and hydrogen.

When detecting the palladium-concentrated region, it is very difficult to analyze the palladium-concentrated region under all the forming conditions employable for the ball bonding, but as long as the palladium-concentrated region is detected under the above-described conditions as a representative example, the same palladium-concentrated region can be detected even under other conditions. Accordingly, it is possible to improve the bonding reliability of the first bonding and suppress the occurrence of a shrinkage cavity in the free air ball simultaneously.

Incidentally, in the embodiment, regarding measurement conditions of the concentration of palladium of the palladium-concentrated region, Auger electron spectroscopy analysis conditions only need to be set that an acceleration voltage of a primary electron beam is 10 kV, a measurement region calculated from a set value is 15 $\mu m^2$ or more and 20 $\mu m^2$ or less, an acceleration voltage of argon ion sputtering is 1 kV, and a sputtering rate is 2.5 nm/min (in terms of $SiO_2$) as setting conditions of a device.

Incidentally, a diameter of the palladium-coated copper bonding wire is preferably 10 μm or more and 30 μm or less.

In the palladium-coated copper bonding wire of the embodiment, 50.0% or more of the sulfur group element is preferably contained in the palladium layer.

In the palladium-coated copper bonding wire of the embodiment, 50.0% or more of the sulfur group element is preferably contained between the surface of the palladium-coated copper bonding wire and a place with 50.0 atom % of palladium relative to the total of palladium and copper.

In the palladium-coated copper bonding wire of the embodiment, the sulfur group element is contained in the palladium layer, thereby facilitating the formation of the above-described palladium-concentrated region.

The palladium-coated copper bonding wire of the embodiment preferably includes a gold layer on a surface of the palladium layer.

Even when the palladium-coated copper bonding wire of the embodiment includes the gold layer on the surface of the palladium layer, the palladium-concentrated region can be formed in the same manner as in the case of including no gold layer, resulting in that it is possible to improve the bonding reliability of the first bonding and suppress the occurrence of a shrinkage cavity in the free air ball simultaneously.

The manufacturing method of the palladium-coated copper bonding wire of the embodiment is a method of manufacturing a palladium-coated copper bonding wire including: a core material containing copper as a main component; and a palladium layer on the core material, and containing a sulfur group element, in which a concentration of palladium is 1.0 mass % or more and 4.0 mass % or less relative to the total of copper, palladium, and the sulfur group element, a total concentration of the sulfur group element is 50 mass ppm or less, and a concentration of sulfur (S) is 5 mass ppm or more and 12 mass ppm or less, a concentration of selenium (Se) is 5 mass ppm or more and 20 mass ppm or less, or a concentration of tellurium (Te) is 15 mass ppm or more and 50 mass ppm or less, the manufacturing method including: preparing a copper wire rod containing copper as a main component and forming a palladium layer containing the sulfur group element on a surface of the copper wire rod.

In this description, the symbol "-" represents a numerical range including the numerical values on the left and right of the symbol.

According to the palladium-coated copper bonding wire of the embodiment, when used for ball bonding, excellent bonding reliability can be maintained for a long period of time even in high-temperature and high-humidity environments without forming a problematic large shrinkage cavity in a surface of a ball during ball formation.

Further, according to the method of manufacturing the palladium-coated copper bonding wire of the embodiment, it is possible to provide a palladium-coated copper bonding wire capable of maintaining high bonding reliability even in high-temperature and high-humidity environments.

DETAILED DESCRIPTION

Figure 1:
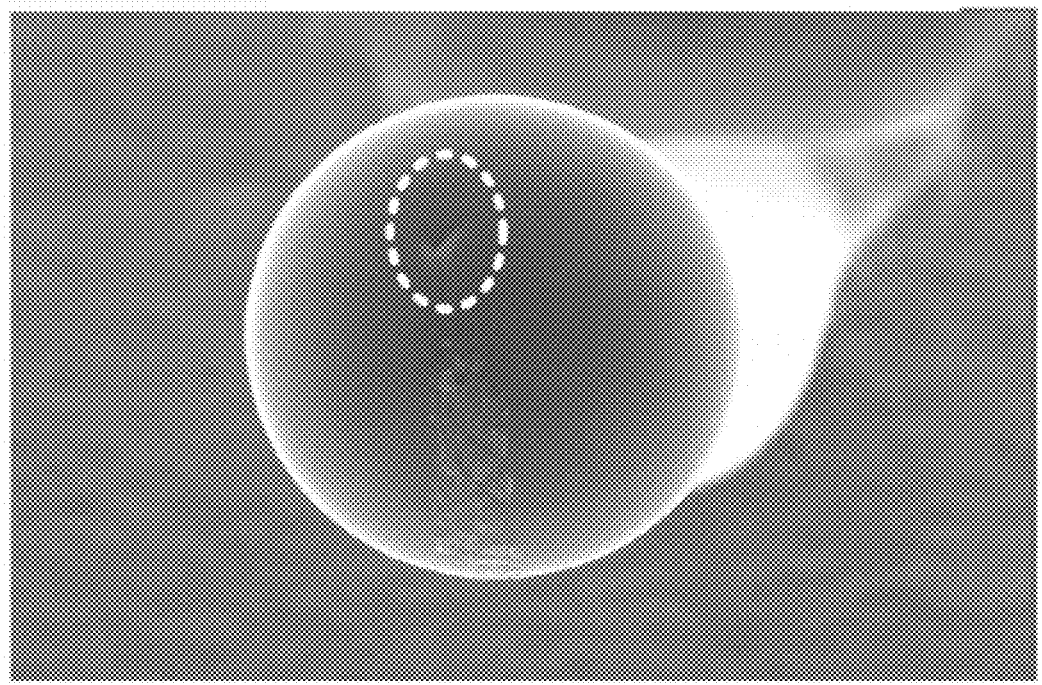
FIG. 1 is a photograph of a solidified free air ball having an unproblematic small shrinkage cavity observed in an example.

Hereinafter, there will be explained an embodiment in detail.

A palladium (Pd)-coated copper bonding wire in this embodiment includes a core material containing copper as a main component and a palladium layer on the core material. Then, the palladium-coated copper bonding wire contains sulfur group elements, in which the concentration of palladium is 1.0-4.0 mass % relative to the total of copper, palladium, and the sulfur group elements, and when two or more sulfur group elements are contained, the total concentration of them is 50 mass ppm or less.

In the palladium-coated copper bonding wire in this embodiment, the concentration of palladium derived from the copper core material is preferably 1.5 mass % or less, relative to the total of copper, palladium, and the sulfur group elements in the entire wire. When 1.5 mass % or less of the palladium derived from the copper core material is contained, it becomes easier to obtain high reliability of first bonding without increasing a resistance value. When the copper core material contains palladium, the concentration of palladium in the entire wire is the sum of the concentration of palladium derived from the palladium layer and the concentration of palladium derived from the copper core material. The concentration of palladium derived from the palladium layer is preferably 1.0-2.5 mass % relative to the total of copper, palladium, and the sulfur group elements in the entire wire.

The palladium (Pd)-coated copper bonding wire in this embodiment has 1.0 mass % or more of the concentration of palladium and contains a predetermined amount of each of the sulfur group elements, thereby making it possible to enhance ball bonding reliability, resulting in that excellent ball bondability is maintained for a long period of time even under high-temperature and high-humidity. When the concentration of palladium is 4.0 mass % or less, in particular, the concentration of palladium derived from the palladium layer is 2.5 mass % or less, the occurrence of a shrinkage cavity in a free air ball (FAB) can be suppressed. As above, the concentration of palladium is 1.0-4.0 mass % and a predetermined amount of each of the sulfur group elements is contained, thereby making it possible to achieve both the high reliability of ball bonding and the suppression of occurrence of a shrinkage cavity during free air ball formation.

From the viewpoint of obtaining the high reliability of ball bonding, the concentration of palladium derived from the palladium layer is preferably 1.3 mass % or more. From the viewpoint of suppressing the occurrence of a shrinkage cavity, the concentration of palladium derived from the palladium layer is preferably 2.3 mass % or less.

The concentration of palladium derived from the palladium layer can be calculated by measuring the concentration of palladium in the entire wire and the concentration of palladium in the copper core material and using these. Concretely, the concentration can be analyzed by a secondary ion mass spectrometry (SIMS) analysis as follows. First, a wire to be measured is pressed and flattened. An SIMS spectrometer (for example, IMS-7f secondary ion mass spectrometer manufactured by CAMECA) is used to measure the concentration of palladium in a copper (Cu) core material of the flattened wire. A palladium layer of the surface of the above-described flattened wire is removed by sputtering in the above-described spectrometer to expose copper. To expose copper (Cu), for example, a wire with a diameter of 10 μm-30 μm is sputtered for at least 0.5 μm or more in terms of palladium (Pd) from the surface to remove the palladium layer, and then is analyzed to a depth of 2.0 μm by starting the SIMS analysis. For example, 100 points or more are measured until an analysis end point (2.0 μm in depth) since an analysis start point to calculate the average concentration of these 100 points. The analysis conditions are as follows: for example, primary ion species of $Cs^+$, a primary ion acceleration voltage of 15.0 keV, a primary ion irradiation region of about 30 μm×30 μm, and an analysis region of about 12 μm×12 μm as the setting conditions of the SIMS spectrometer. The SIMS analysis is performed in a manner that secondary ions released by sputtering while using the primary ions such as $Cs^+$ are detected with a mass spectrometer to be subjected to an elemental analysis, but the concentration of palladium can be found by converting a measured secondary ion intensity of palladium (Pd) to a concentration using a copper (Cu) wire whose concentration of palladium (Pd) has been already known as a standard sample.

The sulfur group elements are mainly contained in the palladium layer. However, the amount of the sulfur group elements is extremely small, and thus various analytical methods sometimes fail to accurately measure where the sulfur group elements are present and the concentration thereof in a configuration with an extremely thin palladium layer, in particular, currently. For this reason, the amount of the sulfur group elements is set to be in the above-described range as an amount relative to the entire palladium-coated copper bonding wire.

In the palladium-coated copper bonding wire in this embodiment, in a range from a surface of a tip portion of a free air ball (approximately a tip portion of a free air ball on the side opposite to a wire neck portion), which is formed using the palladium-coated copper bonding wire, to 5.0 nm or more and 100.0 nm or less in a depth direction, a palladium-concentrated region containing 6.5-30.0 atom % of palladium on average relative to the total of copper and palladium can be observed.

When such a palladium-concentrated region is included, it can be presumed that the palladium-concentrated region, which is a palladium-rich state, is formed in layers in the entire vicinity of the surface of the ball or in a partial range including the tip portion. The palladium contained in the palladium-concentrated region may be derived from the core material, the palladium layer, or both. Then, the present inventors have completed the present invention based on the findings that the formation of such a palladium-concentrated region makes it possible to improve the bonding reliability of the first bonding and suppress the occurrence of a shrinkage cavity in the free air ball simultaneously. Concretely, according to the palladium-coated copper bonding wire in this embodiment, excellent bonding reliability can be maintained for a long period of time even in high-temperature and high-humidity environments. The concentration of palladium in the palladium-concentrated region is preferably 7.0-25.0 atom %, and when the concentration is in this range, chip damage can be further suppressed to improve the yield of a semiconductor device. The palladium-concentrated region can be observed by an Auger (FE-AES) analysis, as will be described later.

In the palladium-coated copper bonding wire in this embodiment, typically, the above-described specific amount of the sulfur group elements is contained in the palladium layer, and thereby the palladium-concentrated region can be formed.

When the palladium-coated copper bonding wire in this embodiment is used to form a free air ball, most of the palladium remains near the surface without being diffusively absorbed into the inside of the ball during ball melting. The palladium remaining near the surface forms a palladium-concentrated region on the surface of the solidified ball. Therefore, the palladium-concentrated region has the above-described composition as traces of the palladium remaining near the surface of the free air ball before solidification. When bonding to an aluminum electrode, the presence of the palladium-concentrated region at the place where the free air ball and the electrode are bonded can improve the bonding reliability of the ball bonding (first bonding).

According to the palladium-coated copper bonding wire in this embodiment, which is configured to form the palladium-concentrated region having a predetermined composition in the embodiment as traces of the palladium remaining on the surface of the free air ball as described above, it is possible to achieve both the high reliability of the first bonding and the prevention of a shrinkage cavity during free air ball formation.

The free air ball during the first bonding is formed under the following conditions, for example. When the diameter of the palladium-coated copper bonding wire is 10-30 μm, preferably 15-25 μm, and more preferably 18-20 μm, arc discharge conditions are set so that a discharge current value becomes 30-90 mA and the diameter of the free air ball becomes 1.5-2.3 times the diameter of the wire. For a bonder apparatus, a commercially available product such as a bonder apparatus (IConn ProCu PLUS) manufactured by K and S Co., Ltd., for example, can be used. When using such a bonder apparatus, the apparatus is preferably set that a discharge time is 50-1000 μs, an EFO-Gap is 25-45 mil (about 635-1143 μm), and a tail length is 6-12 mil (about 152-305 μm). When another bonder apparatus other than this bonder apparatus is used, the setting conditions of the apparatus only need to be adjusted according to a target ball diameter to obtain the same ball diameter as above. Further, in order to make a mixed gas atmosphere of nitrogen and hydrogen or a nitrogen gas atmosphere for the tip portion of the wire, the above-described gas is sprayed at a gas flow rate of, for example, 0.2-0.8 L/min, preferably 0.3-0.6 L/min, and more preferably 0.5 L/min. The gas during the free air ball formation is preferred to be a mixed gas of 95.0 vol % of nitrogen and 5.0 vol % of hydrogen, and the diameter of the free air ball is preferably made to fall within the above-described range as the target value.

Therefore, when observing whether or not the palladium-concentrated region is formed for a predetermined wire, the above-described concentrated region may be measured using a free air ball formed in the presence of a mixed gas of nitrogen and hydrogen, with the discharge current value of 65 mA and the diameter of the ball of 1.8=0.3 times the diameter of the wire in the above-described range representatively. The ball diameter is a target value or an actual measured value, but is preferred to be the actual measured value.

The typical measurement conditions in the case of measuring the palladium-concentrated region by the FE-AES analysis are as follows: in wires with a diameter of 10-30 μm, preferably 15-25 μm, and more preferably 18-20 μm, the FE-AES electron spectrometer is used to analyze a tip portion of a free air ball from the surface to 100.0 nm in the depth direction. The measurement conditions at this time are as follows: for example, an acceleration voltage of a primary electron beam of 10 kV, a current of 50 nA or less (preferably 50 nA), an acceleration voltage of argon ion sputtering of 1 kV, and a sputtering rate of 2.5 nm/min (in terms of $SiO_2$) as the settings of the FE-AES electron spectrometer. The area of a measurement region calculated from a set value is 15 $\mu m^2$ or more and 20 $\mu m^2$ or less, and is set to a substantially circular shape or a substantially square shape, for example. Concretely, as the measurement region, a substantially circular shape having a diameter of 5 μm or a substantially square shape of 4 μm×4 μm can be used. Incidentally, an analysis region, which is a set value, is preferably a region that has the above-described area and has a smaller outer peripheral length, for example, a square or a circle. More concretely, a more appropriate analysis is possible by adjusting the maximum distance from the center of gravity of a plane figure formed by at least an outer peripheral line of the analysis region to the outer peripheral line to be 3 μm or less. In order to improve the analytical accuracy, the Auger analysis is performed at nine or more points at even intervals in the depth direction, and an average value of the analysis is calculated. Further, the measurement region can be evaluated as a region assuming that the beam is emitted vertically to a predetermined plane, without considering the inclination of the sample.

The palladium-concentrated region can be measured as a region with 6.5-30.0 atom % on average of palladium relative to the total of copper and palladium in the FE-AES profile from the surface to 5.0-100.0 nm in depth. At this time, depending on the measurement location, the region with 6.5-30.0 atom % of palladium may be discontinuous, but in such a case, a range including all the regions with 6.5-30.0 atom % of palladium can be identified as the palladium-concentrated region. Incidentally, the FE-AES profile may contain noise due to extraneous matters or the like, and thus the measurement is performed from a range deeper than 5 nm from the surface.

It is normal that in the case of using the palladium-coated copper bonding wire in this embodiment, the concentration of palladium of the palladium-concentrated region of the free air ball is substantially constant in the depth direction from the surface, or the palladium-concentrated region is formed so that the concentration of palladium decreases gradually. Therefore, as the palladium-concentrated region, a range of 5 nm or more and 300 nm or less is preferable, and a range of 400 nm or less is more preferable. That is, a palladium-concentrated region having the above-described specific concentration as the average concentration of palladium, which is within the preferred thickness range from the surface, is preferably observed. This is because the thicker the palladium-concentrated region, the easier it is to obtain the effect of improving bonding reliability. On the other hand, the thickness of the palladium-concentrated region is thought to be about 1.5 μm or less and preferably suppressed to 1.0 μm or less, when the diameter of the wire is 10-30 μm, because the concentration of palladium in the entire wire is the above-described specific concentration. Since the palladium-concentrated region is suppressed to the above-described thickness, it is less likely to damage a semiconductor chip.

Further, when the palladium-coated copper bonding wire in the above-described embodiment is used to be ball bonded onto an aluminum-containing electrode, near a bonding surface, a palladium-concentrated bonding region can be formed where the concentration of palladium is 2.0 mass % or more relative to the total of aluminum, palladium, and copper. That is, at each depth in the range where aluminum is greater than 0 mass % and 100 mass % or less relative to the total mass of palladium, copper, and aluminum, the range including a portion where the mass ratio of palladium is 2.0 mass % or more or preferably 5.0 mass % or more is the palladium-concentrated bonding region. The bonding surface is the surface where the free air ball and the electrode are in contact with each other to be bonded. The bonding surface may be defined as the intersection of graphs of aluminum and copper in an FE-SEM/EDX line analysis, for example.

Having the palladium-concentrated bonding region with such a composition makes it possible to inhibit corrosion of a ball bonding portion, prevent breaks and separation, and improve bonding reliability. The electrode is formed, for example, by coating a surface of a silicon (Si) base material with an electrode material such as Al, AlSiCu (for example, Al—Cu (0.2-0.9 mass %)-Si (0.5-1.5 mass %)), or AlCu (for example, Al—Cu (0.2-0.9 mass %)). Further, the temperature of the electrode during ball bonding is 140-200° ° C., for example.

A method of analyzing this palladium-concentrated bonding region is explained using, as an example, the case where a pure aluminum electrode is employed as a bonding target. The palladium-coated copper bonding wire is used to form a free air ball under the free air ball forming conditions at the above-described observation time, and the ball is bonded onto the aluminum electrode. The ball bonding portion is cut so as to make a surface parallel to the center line in the longitudinal direction of the wire exposed. The cut surface is subjected to a line analysis from a predetermined point on the wire side in a direction substantially vertical to the bonding surface (depth direction). As the line analysis, for example, field-emission scanning electron microscopy/energy dispersive X-ray spectrometry (FE-SEM/EDX) is suitable.

When observing the palladium-concentrated bonding region by the FE-SEM/EDX line analysis, for example, the mass ratio of palladium to the total mass of palladium, copper, and aluminum is found at each measurement point in the range where aluminum is greater than 0.5 mass % and 95.0 mass % or less relative to the total mass of palladium, copper, and aluminum. A predetermined range where this mass ratio is 2.0 mass % or more or preferably 5.0 mass % or more can be evaluated as the palladium-concentrated bonding region. The reason why the measurement is performed in the range where the concentration of aluminum is greater than 0.5 mass % and 95.0 mass % or less is here because an analytical value of the place with no presence of aluminum is not 0 mass % due to effects of noise, and so on in analysis, or an analytical value of the place with the presence of only aluminum is not 100 mass % in some cases.

The concentration of palladium in the palladium-concentrated bonding region is, for example, 30.0 mass % or less and preferably 20.0 mass % or less.

As for the palladium bonding concentrated region, a region where palladium is 2.0 mass % or more relative to the total of palladium, copper, and aluminum, for example, may be discontinuous. In such a case, as long as the range with 2.0 mass % or more of the concentration of palladium continues for 0.2 µm or more in a wire with a diameter of 10-30 µm in the case where the total of aluminum, palladium, and copper is set to 100 mass % in the concentration profile of the FE-SEM/EDX analysis, for example, it is possible to evaluate that the palladium bonding concentrated region is present. This range with 2.0 mass % or more of the concentration of palladium is preferably present in the range from the intersection of copper and aluminum to 1.0 µm on the wire side. Incidentally, as the line analysis region, it is preferable to analyze a region where the intensity peak of palladium is detected in an FE-SEM/EDX mapping analysis.

The palladium-coated copper bonding wire in the embodiment enables the formation of such a palladium-concentrated bonding region, thus making it possible to inhibit corrosion of the ball bonding portion, prevent breaks and separation, and improve bonding reliability.

In order to obtain highly reliable bonding, the width of the palladium-concentrated bonding region near the above-described bonding surface is preferably 0.2 µm-2.0 µm, and more preferably 0.5 µm-1.8 µm.

To summarize the above, the palladium-coated copper bonding wire in the embodiment is a palladium-coated copper bonding wire including a core material containing copper as a main component and a palladium layer on the core material and containing sulfur group elements, in which a concentration of palladium is 1.0 mass % or more and 4.0 mass % or less relative to the total of copper, palladium, and the sulfur group elements of the palladium-coated copper bonding wire, the total concentration of the sulfur group elements is 50 mass ppm or less, and a concentration of sulfur (S) is 5 mass ppm or more and 12 mass ppm or less, a concentration of selenium (Se) is 5 mass ppm or more and 20 mass ppm or less, or a concentration of tellurium (Te) is 15 mass ppm or more and 50 mass ppm or less, and in a wire bonding structure made by the palladium-coated copper bonding wire being ball bonded onto an aluminum electrode, a palladium-concentrated bonding region with 2.0 mass % or more of the concentration of palladium relative to the total of aluminum, palladium, and copper is formed near a ball bonding surface on the aluminum electrode.

Further, the wire bonding structure in the embodiment is a wire bonding structure in which a palladium-coated copper bonding wire including a core material containing copper as a main component and a palladium layer on the core material and containing sulfur group elements is ball bonded onto an aluminum-containing electrode of a semiconductor chip, and in a wire portion of the palladium-coated copper bonding wire, a concentration of palladium is 1.0 mass % or more and 4.0 mass % or less relative to the total of copper, palladium, and the sulfur group elements, the total concentration of the sulfur group elements is 50 mass ppm or less, and a concentration of sulfur (S) is 5 mass ppm or more and 12 mass ppm or less, a concentration of selenium (Se) is 5 mass ppm or more and 20 mass ppm or less, or a concentration of tellurium (Te) is 15 mass ppm or more and 50 mass ppm or less, and the palladium-coated copper bonding wire includes a palladium-concentrated bonding region with 2.0 mass % or more of the concentration of palladium relative to the total of aluminum, copper, and palladium near a ball bonding surface on the electrode.

Next, there is explained a configuration of the palladium-coated copper bonding wire in this embodiment.

The core material in the palladium-coated copper bonding wire in this embodiment is copper or a copper alloy made of copper as a main component. The main component here means that the component is central in quantity or properties, and the content is at least 50.0 mass %. The properties as the main component are properties required for the configuration, which are, for example, mechanical properties such as a wire breaking force and an elongation percentage in the case of the copper core material. The main component can be said to be, for example, a component that centrally affects such properties.

In addition to copper (Cu), the copper core material may also contain trace elements such as inevitable impurities and additive elements. The additive elements are elements to be added in trace amounts for the purpose of improving properties such as oxidation resistance and toughness of the palladium-coated copper bonding wire, and the like generally. Such trace elements are, for example, P, Au, Pd, Pt, Ni, Ag, Rh, In, Ga, Fe, and so on. The ratio of the trace elements in the copper core material is preferably 1.5 mass % or less, more preferably 1.0 mass % or less, further preferably 0.01 mass % or less, even more preferably 0.001 mass % or less, and particularly preferably 0.0001 mass % or less. When the concentration of the trace elements in the copper core material exceeds 1.5 mass %, wire drawability may deteriorate, a specific resistance may increase, or chip damage may occur during the first bonding.

The content ratios of the trace elements in the copper and elements to be contained in the wire are generally measured by a chemical analysis such as an inductively coupled plasma (ICP) emission spectrochemical analysis, but the measurement is not limited thereto. For example, when a metallic element of the same type as a coating layer is contained in the copper core material, the content ratio of the metallic element can be measured by the SIMS analysis in the same manner as the palladium in the above-described copper core material.

The palladium layer can be analyzed as a region ranging from where the ratio of palladium is 50.0 atom % relative to the total of copper and palladium to the surface of the palladium layer in the Auger (FE-AES) analysis profile in the depth direction from the surface of the wire. Where the ratio of palladium is 50.0 atom % is the boundary between the copper core material and the palladium layer. In the case where the palladium layer is so thin that it is difficult to clearly measure the thickness of the palladium layer or the existing ratio of palladium in a specific place even by the FE-AES analysis, the FE-AES analysis may be further combined with an analysis by scanning transmission electron microscopy/energy dispersive X-ray spectrometry (TEM/EDX), an analysis by spherical aberration-corrected scanning transmission electron microscopy/energy dispersive X-ray spectrometry (STEM/EDX), an atomic number contrast image (HAADF image), or the like appropriately.

The thickness of the palladium layer is preferably, depending on the diameter of the palladium-coated copper bonding wire, 0.020 μm or more and 0.150 μm or less, and more preferably 0.030 μm or more and 0.130 μm or less when the diameter of the wire is 10 μm-30 μm. This is because when the thickness of the palladium layer is uniform within the above-described range, leaning resistance when the bonding wire is bonded and the quality of loop characteristics such as stability of a loop height are improved. As a method of measuring the thickness of the palladium layer, the above-described FE-AES analysis can be used, and as described above, in order to improve the measurement accuracy, the analysis by TEM/EDX, the analysis by STEM/EDX, the HAADF image, or the like may be used in combination appropriately.

The palladium-coated copper bonding wire in this embodiment contains the sulfur group elements (one or more of sulfur, selenium, and tellurium), and when containing two or more of the sulfur group elements, the total concentration of the sulfur group elements in the entire wire is 50 mass ppm or less. The total concentration of the sulfur group elements in the entire wire is preferably 5 mass ppm or more, which makes it easy to obtain ball bonding reliability. From the viewpoint of ball bonding reliability, the total concentration of the sulfur group elements in the entire wire is preferably 6 mass ppm or more. Further, when the concentration of the sulfur group elements exceeds 50 mass ppm, the palladium layer becomes brittle, cracks occur in the palladium layer during wire drawing, and the cracks cause the wire to break, resulting in poor wire drawability. In order to improve the wire drawability, the concentration of the sulfur group elements is preferably 45 mass ppm or less and more preferably 41 mass ppm or less.

In the palladium-coated copper bonding wire in this embodiment, among the above-described sulfur group elements, the concentration of sulfur (S) is 5 mass ppm or more in the entire wire, and preferably 6 mass ppm or more. The concentration of sulfur (S) is 5 mass ppm or more, which makes it possible to enhance the ball bonding reliability. On the other hand, the concentration of sulfur (S) is 12 mass ppm or less in the entire wire, and when the concentration exceeds this, the palladium layer becomes brittle, cracks occur in the palladium layer, and the cracks cause the wire to break, resulting in poor wire drawability. The concentration of sulfur (S) is preferably 10 mass ppm or less in the entire wire.

Further, the concentration of selenium (Se) is 5 mass ppm or more in the entire wire, preferably 6 mass ppm or more, and more preferably 8 mass ppm or more. The concentration of selenium (Se) is 5 mass ppm or more, which makes it possible to enhance the ball bonding reliability. On the other hand, the concentration of selenium (Se) is 20 mass ppm or less in the entire wire, and when the concentration exceeds this, the palladium layer becomes brittle, cracks occur in the palladium layer, and the cracks cause the wire to break, resulting in poor wire drawability. The concentration of selenium (Se) is preferably 15 mass ppm or less in the entire wire.

Further, the concentration of tellurium (Te) is 15 mass ppm or more in the entire wire, and more preferably 16 mass ppm or more. The concentration of tellurium (Te) is 15 mass ppm or more, which makes it possible to enhance the ball bonding reliability. On the other hand, the concentration of tellurium (Te) is 50 mass ppm or less in the entire wire, and when the concentration exceeds this, the palladium layer becomes brittle, cracks occur in the palladium layer, and the cracks cause the wire to break, resulting in poor wire drawability. The concentration of tellurium (Te) is preferably 45 mass ppm or less in the entire wire, and more preferably 41 mass ppm or less.

The palladium-coated copper bonding wire in this embodiment may contain only one of the sulfur group elements or two or more of them, as long as the total concentration of the sulfur group elements is within a range of 50 mass ppm or less and one of sulfur, selenium, and tellurium satisfies the above-described concentration range.

The palladium-coated copper bonding wire in this embodiment may include a second layer made of metal other than palladium on the palladium layer. The metal of the second layer may be a pure metal, or an alloy of two or more metals mixed together. When the palladium-coated copper bonding wire includes the second layer on the palladium layer, the boundary between the palladium layer and the second layer can be measured as a portion where the concentration of the main component metal in the second layer is 50.0% relative to the maximum concentration. In the case of including a third layer and a fourth layer on the surface of the second layer, the analysis can be performed according to the above.

The palladium-coated copper bonding wire in this embodiment preferably includes a gold layer in the outermost layer as a layer other than the palladium layer. The palladium-coated copper wire in this embodiment includes the gold layer, thereby making it possible to improve bondability of the second bonding and reduce die wear during wire drawing simultaneously. The gold layer is a layer formed of gold as its main component. The gold layer may be partially interrupted as long as it is formed over the surface of the palladium layer, and palladium may be contained in the gold layer. When palladium is contained in the gold layer, the concentration of palladium may be uniform in the thickness direction or may have a concentration gradient that decays toward the surface. Further, when the gold layer is formed of an alloy of two or more metals mixed together, the gold layer may contain silver, copper, and so on in addition to palladium and gold unless the effect of the embodiment is impaired. In this case, the amount of metal elements other than palladium in the gold layer is, for example, less than 50.0 mass %.

When the palladium-coated copper bonding wire in this embodiment includes the gold layer, the concentration of gold derived from this gold layer in the entire wire is preferably 0.01 mass % or more and more preferably 0.05 mass % or more. When the concentration of gold derived from the gold layer is 0.01 mass % or more, the second bondability tends to improve and the die wear during wire drawing is reduced easily. The concentration of gold derived from the gold layer in the entire wire is preferably 0.20 mass % or less and more preferably 0.15 mass % or less. When the concentration of gold derived from the gold layer is 0.20 mass % or less, it is less likely to adversely affect the wire performance and less likely to impair the sphericity of the free air ball. Incidentally, when the copper core material contains gold, the concentration of gold in the entire wire is the sum of the concentration of gold derived from the above-described gold layer and the concentration of gold in the copper core material. Therefore, when measuring the concentration of gold derived from the gold layer, the concentration of gold in the entire wire and the concentration of gold in the copper core material can be measured individually, to calculate the concentration of gold derived from the gold layer using these concentrations. The concentration of gold derived from the gold layer can be measured by the SIMS analysis concretely in the same manner as the concentration of palladium derived from the above-described palladium layer.

The thickness of the gold layer is preferably, depending on the diameter of the palladium-coated copper bonding wire, 8 nm or less and more preferably 5 nm or less. When the thickness of the gold layer is 8 nm or less, it is easy to maintain high reliability of the first bonding without impairing the sphericity of the free air ball even with the gold layer. The lower limit of the thickness of the gold layer is not particularly limited, but it is sufficient as long as a later-described concentration-converted average film thickness is 1 nm or more. As a method of measuring the thickness of the gold layer, the FE-AES analysis can be used as in the case of the palladium layer.

Incidentally, the thickness of the gold layer becomes significantly thin when the concentration of gold in the entire wire is in the above-described preferred range. When the thickness of the gold layer becomes significantly thin as above, it is currently difficult to accurately measure the thickness of the gold layer by using general measurement methods. Therefore, when the thickness of the gold layer becomes significantly thin, the thickness of the gold layer can be evaluated by the concentration-converted average film thickness, which is calculated using the concentration of gold in the entire wire and the diameter of the wire. Examples of a method of obtaining this concentration-converted average film thickness include: a method of calculating the mass of gold per unit length based on the concentration of gold and the specific gravity of gold, and then finding the film thickness assuming that the wire cross section is a perfect circle and gold is uniformly present on the uppermost surface; and a method of performing a proportional calculation using a thickness of a gold coating at a plated wire diameter, (which may be a design value), and a final wire diameter.

Here, the reason why the configuration in the above-described embodiment enables achievement of both the ball bonding reliability and the suppression of occurrence of a shrinkage cavity is assumed as follows, as an example. In the ball bonding, an arc discharge is formed between a discharge torch and a wire tip, and by the heat from an arc current, the tip of a ball melts and a free air ball is formed. At this time, in a conventional palladium-coated copper wire, where the concentration of palladium in the ball bonding portion does not increase, palladium on the outer side of the wire is diffusively absorbed into the inside of the molten ball during the process of forming a free air ball from the metal of the wire molten by the arc heat input and the additive elements. When such a conventional wire is ball bonded onto an aluminum-containing electrode, a copper-aluminum intermetallic compound, such as, for example, $Cu_9Al_4$, is easily corroded at the bonding interface between the aluminum-containing electrode and a ball bonding portion because the vicinity of a bonding surface does not become rich in palladium.

In semiconductor products, it is normal that the entire wire bonding is encapsulated in resin or the like. Halogen elements such as chlorine and bromine derived from this encapsulating resin, as well as moisture, sulfur, and so on from the atmosphere, enter the ball bonding interface to corrode the copper-aluminum intermetallic compound at the ball bonding interface, which has been problematic. Then, the higher the temperature and humidity of the atmosphere of the semiconductor element, the greater the corrosion tends to be. As the corrosion at the ball bonding interface progresses, separation and breaks occur at the ball bonding interface to cause an increase in electrical resistance, resulting in a problem of poor current flow.

In contrast to this, it is thought that in the wire having the specific composition and configuration in this embodiment, the diffusion and absorption of palladium into the inside of the molten ball is suppressed during the process of forming the free air ball, and the unabsorbed palladium is concentrated and distributed near the surface of the ball to cover the surface of the ball. When the ball is bonded onto the aluminum-containing electrode with this unabsorbed palladium covering the surface of the free air ball, the bonding interface becomes rich in palladium, which has strong corrosion resistance. Therefore, it is presumed that the formation of the copper-aluminum intermetallic compound is suppressed, and further the corrosion caused by halogen (chlorine in particular), sulfur, water, and so on coming from the outside is also suppressed. As a result, the ball bonding reliability improves, thereby making it possible to significantly improve the reliability under the high-temperature and high-humidity conditions in particular. From this point of view, the lower limit of the concentration of palladium in the wire is determined as the range that improves the ball bonding reliability.

On the other hand, as described above, even the configuration with the surface of the free air ball made rich in palladium often failed to improve the bonding reliability when aiming for use under severe conditions. The reason for this is thought that an object to be subjected to the second bonding of the wire bonding has a gold plating, silver plating, or the like on its surface in many cases, and the gold or silver derived from this plating adheres to a tail portion of the wire (an end portion of the wire that has been torn off) when the wire is cut after the second bonding of the wire bonding, causing a shrinkage cavity. The "shrinkage cavity" is a wrinkle-like groove observed in the surface of the solidified free air ball. When there is a shrinkage cavity in the surface of the solidified free air ball, a void is made in a portion, of the ball bonding surface of the electrode on the semiconductor chip, corresponding to the above-described groove. Therefore, it is thought that depending on the size of the void, a bonding strength of the ball bonding surface is weakened with time starting from this void or corrosion is likely to occur, thereby reducing the bonding reliability.

Here, as a result of the earnest examination, the inventors found out that some of the above-described shrinkage cavities are problematic and large, and the others are unproblematic and small. That is, when the surface of the solidified free air ball has a shrinkage cavity having a predetermined size or more, the void at the interface between the electrode and the ball bonding portion tends to be large, causing a significant decrease in the bonding reliability. On the other hand, when the shrinkage cavity is smaller than the above-described size, the effect on the bonding reliability will not be a problem because the void is small. As the size of the shrinkage cavity that does not cause such a problem, the maximum length of the shrinkage cavity only needs to be two-thirds or less of the diameter of a wire in an SEM observation photograph of the shrinkage cavity. For example, when the diameter of the wire is 18 μm, the shrinkage cavity having a maximum length of greater than 12 μm can be sufficiently identified as a problematic large shrinkage cavity. It is presumed that the shrinkage cavities smaller than this size have little effect on the bonding reliability.

Then, they found out that the reason why the problematic large shrinkage cavity is formed relies on the concentration of palladium of the palladium-concentrated region (actually a mixed region of palladium and copper) covering the surface of the free air ball. That is, in the case where the concentration of palladium of the palladium-concentrated region on the surface of the free air ball exceeds a certain concentration, when the palladium-concentrated region solidifies, the inside of the ball is still soft, and thus, due to factors such as the difference in composition between the gold adhering portion near the surface of the free air ball and the region without gold adhesion, the difference in solidification speed widens and the gold adhering portion becomes a final solidification portion. Then, it was presumed that when the molten ball becomes solid, the gold adhering portion, where shrinkage is concentrated, shrinks to the inside of the ball, and a problematic large shrinkage cavity is formed. This is applied also to the case where silver adheres to the tail portion.

Conversely, when the concentration of palladium of the palladium-concentrated region is sufficiently low, the time difference in solidification of copper between the palladium-concentrated region and the inside of the ball is thought to be small. As a result, even if gold adheres to the ball, it does not shrink to the inside of the ball, thus not causing a problematic large shrinkage cavity. From such a point of view, the upper limit of the concentration of palladium in the surface of the free air ball is determined. When the ball is bonded onto the aluminum-containing electrode with a large shrinkage cavity being formed in the free air ball, a void is made at the interface between the electrode and the ball bonding portion. As a result, the bonding strength of the ball bonding interface is weakened and corrosion is likely to occur, which are problematic.

The sulfur group elements in the palladium-coated copper bonding wire contribute to the formation of a palladium-distributed region near the surface of the free air ball described above. The sulfur group elements are highly reactive with copper, and thus, it is thought that they are concentrated in a region where copper and palladium are in contact, mainly in the early stage when the metal of the wire melts. Reaction products of the sulfur group elements and copper concentrated in this region where copper and palladium are in contact are thought to shield palladium from dissolution into the molten copper. From such a viewpoint, the amount of the sulfur group elements is determined.

In order to obtain the above-described effect, 50.0% or more of the sulfur group elements contained in the entire palladium-coated copper bonding wire is preferably contained between the surface of the palladium-coated copper bonding wire and a place with 50.0 atom % of palladium relative to the total of palladium and copper. This is thought to facilitate the formation of the palladium-distributed region near the surface of the free air ball, and it is possible to further improve the bonding reliability of the ball bonding.

Next, there is explained a method of manufacturing the palladium-coated copper bonding wire in this embodiment. The palladium-coated copper bonding wire in this embodiment is obtained by coating the surface of a copper wire rod, which contains, as its main component, copper to be a core material, with palladium, performing wire drawing, and performing a heat treatment as necessary. Gold coating may be performed after the palladium coating, or wire drawing and a heat treatment may be performed in stages after palladium or gold coating is performed.

When copper is used as the core material, copper of a predetermined purity is melted, and when a copper alloy is used, copper of a predetermined purity is melted together with additive elements, to thereby obtain a material of a copper core material or a material of a copper alloy core material. A heating furnace such as an arc heating furnace, a high-frequency heating furnace, a resistance heating furnace, or a continuous casting furnace is used for melting. For the purpose of preventing mixture of oxygen and hydrogen from the atmosphere, the atmosphere during copper melting in the heating furnace is preferably maintained to a vacuum or an inert gas atmosphere such as argon or nitrogen. The molten material of the core material is cast and solidified to a predetermined wire diameter from the heating furnace, or the molten material of the core material is cast into a mold to make an ingot, and the ingot is repeatedly rolled and then is drawn to a predetermined wire diameter, and a copper wire rod is obtained.

Examples of the method of coating the surface of the copper wire rod with palladium or gold include a plating method (wet method) and a vapor deposition method (dry method). The plating method may be either an electrolytic plating method or an electroless plating method. Electrolytic plating, such as strike plating or flash plating, is preferable because a plating speed is fast and the adhesion of the palladium layer to the core material is good when the electrolytic plating is used for palladium plating. As a method of containing the sulfur group elements in the palladium layer by the plating method, there is a method of using a plating solution containing a plating additive containing sulfur, selenium, or tellurium for a palladium plating solution and adjusting the type and amount of the plating additive in the above-described electrolytic plating. This also makes it possible to adjust the concentration of the sulfur group elements in the wire.

As the vapor deposition method, physical adsorption such as a sputtering method, an ion plating method, or vacuum vapor deposition, and chemical adsorption such as plasma CVD can be used. According to these methods, it is not necessary to clean the palladium coating or the gold coating after formation, and there is no concern about surface contamination or the like during cleaning. As a method of containing the sulfur group elements in the palladium layer by the vapor deposition method, there is a method of forming a palladium layer by magnetron sputtering or the like while using a palladium target containing the sulfur group elements.

In this manner, the palladium-coated and gold-coated copper wire rod is drawn to a final wire diameter and heat treated. The wire drawing and the heat treatment may be performed in stages. In the above, the method of drawing the palladium-coated and gold-coated copper wire rod to a final wire diameter has been described, but the palladium-coated copper wire rod may be drawn to a predetermined wire diameter, and then coated with gold, and thereafter drawn to a final wire diameter.

A working ratio of the wire drawing can be determined according to the mechanical properties such as a breaking force and an elongation percentage required for the palladium-coated copper bonding wire to be manufactured. In general, the working ratio is preferably 90.0% or more as a working ratio in working the copper wire rod with palladium coating and, if necessary, gold coating to a final wire diameter (a working ratio in reducing the wire diameter from the wire diameter after final plating to the final wire diameter). This working ratio can be calculated as a reduction ratio of a wire cross-sectional area. The wire drawing is preferably performed in stages by using a plurality of diamond dies. In this case, a reduction of area (working ratio) per one diamond die is preferably 5.0% to 15.0%.

In the final heat treatment, there is performed a strain relief heat treatment to relieve strain of a metal structure remaining inside the wire at the final wire diameter. Regarding the conditions of the strain relief heat treatment, the temperature and the time are determined in consideration of the required wire properties.

Besides, a heat treatment according to purpose may be performed in any stage of the wire manufacture. Examples of such a heat treatment include a diffusion heat treatment in which adjacent metals are diffused to increase the bonding strength after the palladium coating or the gold coating. Performing the diffusion heat treatment makes it possible to improve the bonding strength between dissimilar metals. Regarding the conditions of the diffusion heat treatment, the temperature and the time are determined in consideration of the required wire properties.

As a method of the heat treatment, a running heat treatment, in which a wire is passed through an atmosphere of a heating vessel heated to a predetermined temperature to be heat treated, is preferred because the heat treatment conditions can be adjusted easily. In the case of the running heat treatment, the heat treatment time can be calculated by the speed at which the wire passes and the distance of the wire passing in the heating vessel. A tubular electric furnace or the like is used as the heating vessel.

According to the palladium-coated copper bonding wire in this embodiment explained above, the shrinkage cavity during ball formation is suppressed, and the ball bonding reliability is excellent even under the high-temperature and high-humidity. Therefore, since a bonding structure with high long-term reliability can be formed, the palladium-coated copper bonding wire in this embodiment is suitable for use in high-temperature and high-humidity environments, such as in devices for automobile use.

(Semiconductor Device and Manufacturing Method Thereof)

Figure 7:
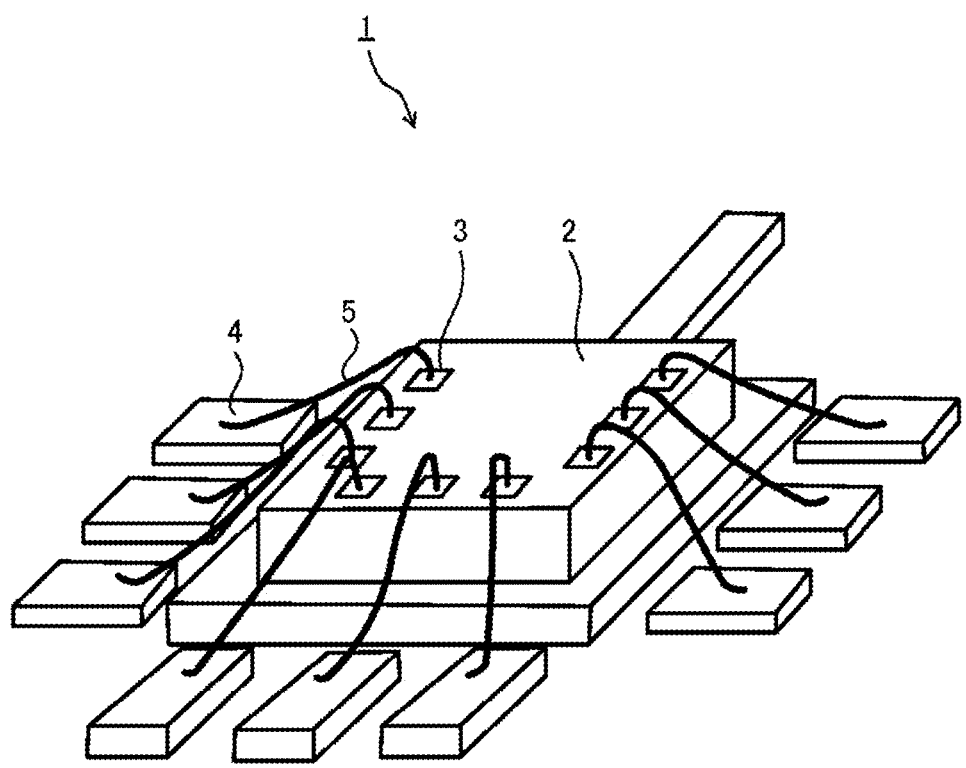
FIG. 7 is a schematic view illustrating a semiconductor device in an embodiment.

Next, there is explained a semiconductor device using the palladium-coated copper bonding wires in the above-described embodiment. As illustrated in FIG. 7, a semiconductor device 1 in this embodiment includes a semiconductor chip 2, aluminum-containing aluminum electrodes 3 provided on the semiconductor chip 2, gold-coated external electrodes 4 provided outside the semiconductor chip 2, and bonding wires 5 connecting the aluminum electrodes 3 and surfaces of the external electrodes 4. Incidentally, in FIG. 7, the case of having a gold coating on the external electrode is explained as an example, but the same is applied even if a silver coating is provided in place of the gold coating or a silver coating is provided together with the gold coating.

In the semiconductor device 1, the bonding wire 5 is made of the palladium-coated copper bonding wire in the above-described embodiment. Further, it includes a palladium-concentrated bonding region with 2.0 mass % or more of the concentration of palladium relative to the total of a constituent element of the surface of the aluminum electrode 3, copper, and palladium in a bonding surface of the aluminum electrode 3 and the bonding wire 5.

The semiconductor chip 2 is made by including an integrated circuit (IC) made of a silicon (Si) semiconductor, a compound semiconductor, or the like. The aluminum electrode is formed, for example, by coating a surface of a silicon (Si) base material with an electrode material such as Al, AlSiCu, or AlCu. The external electrode 4 is an electrode for supplying power to the semiconductor chip 2 from the outside. The power from the external electrode 4 is supplied to the semiconductor chip 2 via the bonding wire 5.

In the manufacture of the semiconductor device 1 in this embodiment, the connection of the aluminum electrode 3 and the external electrode 4 by the bonding wire 5 is made as follows, for example. Using a bonding device, a capillary jig used for the connection by passing a bonding wire through its inside, and so on, for example, heat is input to the tip of the wire gripped by the capillary by arc discharge, to heat and melt the tip of the wire. Thereby, a free air ball is formed at the tip of the wire. Then, for example, with the semiconductor chip 2 heated within a range of 140-200° ° C., this free air ball is crimped and bonded onto the aluminum electrode 3 to form first bonding. After that, the end of the bonding wire 5 on the side opposite to the first bonding is directly bonded to the external electrode 4 by ultrasonic crimping.

In the manufacturing method of the semiconductor device in this embodiment, the free air ball forming conditions are the same as those described above. Concretely, for example, when the diameter of the bonding wire 5 is 10-30 μm, preferably 15-25 μm, and more preferably 18-20 μm, a bonder apparatus is used and arc discharge conditions are set so that a discharge current value is 30-90 mA and the diameter of the free air ball is 1.5-2.3 times the diameter of the wire. For the bonder apparatus, a commercially available product such as a bonder apparatus (fully automatic Cu wire bonder; IConn ProCu PLUS) manufactured by K and S Co., Ltd., for example, can be used. When using such a bonder apparatus, the apparatus is preferably set that a discharge time is 50-1000 μs, an EFO-Gap is 25-45 mil (about 635-1143 μm), and a tail length is 6-12 mil (about 152-305 μm). When another bonder apparatus other than this bonder apparatus is used, the conditions only need to be the same as above, which is, for example, the condition under which the diameter of the free air ball becomes the same size as above. Further, in order to make a mixed gas atmosphere of nitrogen and hydrogen or a nitrogen gas atmosphere for the tip portion of the wire, the above-described gas is sprayed at a gas flow rate of 0.2-0.8 L/min and preferably 0.3-0.6 L/min. The gas when forming the free air ball is preferred to be a mixed gas of 95.0 vol % of nitrogen and 5.0 vol % of hydrogen, and the diameter of the free air ball may be within the above-described range as the target value.

Summarizing the above, the semiconductor device in the embodiment and the manufacturing method of the semiconductor device are as follows. The semiconductor device in the embodiment is a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of the palladium-coated copper bonding wire of the embodiment.

Further, the semiconductor device in the embodiment is a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of a palladium-coated copper wire rod, and the semiconductor device includes a bonding structure including a palladium-concentrated bonding region with 2.0 mass % or more of a concentration of palladium relative to the total of aluminum, copper, and palladium near a bonding surface of the aluminum electrode and the bonding wire.

The method of manufacturing the semiconductor device in the embodiment is a manufacturing method of a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is a palladium-coated copper bonding wire including a core material containing copper as a main component and a palladium layer on the core material, and containing sulfur group elements, in which a concentration of palladium is 1.0 mass % or more and 4.0 mass % or less relative to the total of copper, palladium, and the sulfur group elements of the palladium-coated copper bonding wire and the total concentration of the sulfur group elements is 5.0 mass ppm or more and 50 mass ppm or less. Then, on the tip of the palladium-coated copper bonding wire, a free air ball including a palladium-concentrated region with the average concentration of palladium of 6.5 atom % or more and 30.0 atom % or less relative to the total of copper and palladium within a range from a surface of a tip portion of the ball to 5.0 nm or more and 100.0 nm or less is formed, the palladium-coated copper bonding wire is bonded to the aluminum electrode via the free air ball, and a portion of the palladium-coated copper bonding wire apart from the free air ball by substantially the length of the bonding wire is second bonded to the surface of the external electrode.

The semiconductor device in the embodiment is, for example, for automotive applications.

According to the semiconductor device in this embodiment explained above, in the wire bonding, a shrinkage cavity in the ball during ball bonding is suppressed, and the ball bonding reliability is excellent even under high-temperature and high-humidity conditions. Therefore, since a bonding structure with high long-term reliability can be formed, the semiconductor device in this embodiment is suitable for use in high-temperature and high-humidity environments, such as in devices for automobile use. Further, according to the manufacturing method of the semiconductor device in this embodiment, a bonding structure with high long-term reliability is formed, and thus, it is possible to obtain a semiconductor device suitable for use in high-temperature and high-humidity environments, such as in devices for automobile use.

EXAMPLES

Next, there are explained examples. The embodiment is not limited to the following examples. Examples 1 to 19 and Examples 32 to 34 are examples, and Examples 20 to 31 are comparative examples.

Examples 1 to 18

Copper (Cu) with a purity of 99.99 mass % or more was used as the core material, this was continuously cast and rolled while a preheat treatment being performed thereon, and then primarily drawn, and thereby a copper wire rod (0.5 mm in diameter) was obtained.

The palladium coating layer was formed as follows. Plating baths were prepared by adding additives containing sulfur, selenium, and tellurium to commercially available palladium electroplating baths, and controlling the concentrations of sulfur, selenium, and tellurium in the plating baths so that the concentrations relative to the entire wire (the total of copper, palladium, and sulfur group elements) would be the concentrations described in the table below, respectively. With the copper wire rod immersed in the plating bath, a current was passed through the copper wire rod at a current density of 0.75 A/dm$^2$ to form a palladium coating containing sulfur, selenium, or tellurium. In the case of forming a palladium coating containing two or more of sulfur, selenium, and tellurium, a plating bath containing two or more of the above-described additives was used.

Thereafter, a palladium-coated copper bonding wire with a final diameter of 18 μm or 25 μm was obtained by performing continuous secondary wire drawing with diamond dies in a wet process without performing a baking treatment, followed by performing a refining heat treatment at 480° ° C. for 1 second.

Incidentally, the average working ratio of each example, calculated by wire cross-sectional areas before and after wire drawing from the wire after coating to the final wire diameter, is 99.0% or more in the case of the final wire diameter being 18 μm and 25 μm, and the wire speed in the wire drawing is 100-1000 m/min.

The concentration of palladium in the palladium-coated copper bonding wire was measured as follows. The manufactured wire of about 1000 m was dissolved in aqua regia, and the concentration of palladium (Pd) in the solution was found by high-frequency inductively coupled plasma emission spectroscopy (ICPS-8100 by Shimadzu Corporation).

The concentration of the sulfur group elements in the palladium-coated copper bonding wire was measured as follows. The manufactured wire of about 100 m was dissolved in aqua regia, and the concentration of sulfur (S), selenium (Se), or tellurium (Te) in the solution was found by an inductively coupled plasma mass spectrometer (Agilent 8800 manufactured by Agilent Technologies Japan, Ltd.). The compositions of the obtained palladium-coated copper bonding wires are illustrated in Tables 1, 2.

(Observation of a Crack in a Wire Surface)

The copper wire rod after palladium plating was subjected to a torsion test, and the appearance of the surface of the wire rod that had undergone the torsion test was observed with an optical stereomicroscope (product name: SZX16 manufactured by Olympus Corporation) to evaluate whether a palladium crack had reached copper of the core material. Those with a crack not reaching copper were evaluated as having no crack in a wire surface (G), and those with a crack reaching copper were evaluated as having a crack in a wire surface (P). In the torsion test, TO-202, which is a device name, manufactured by MAEKAWA TESTING MACHINE MFG. Co., Ltd. was used, both ends of an about 20-cm sampled wire were fixed and rotated 180 degrees clockwise and 180 degrees counterclockwise, the rotations were performed for 7 sets, and then the appearance was observed. Results are illustrated in Tables 1, 2. Incidentally, the wires with a crack reaching copper are illustrated as not performed (–) in the table because subsequent evaluations of a shrinkage cavity and a HAST, and so on were not performed thereon.

(Analysis of a Free Air Ball)

With the palladium-coated copper bonding wire with a diameter of 18 μm obtained in Example 1, a free air ball with a diameter of about 33 μm (about 1.8 times the diameter of the wire) was formed in a (fully automatic Cu wire bonder; IConn ProCu PLUS) type ultrasonic device manufactured by K and S Co., Ltd. by setting an arc discharge current value (Electronic Flame-Off (EFO) current value) to 65 mA and adjusting a discharge time in a range of 50-1000 μs. A free air ball forming atmosphere was a mixed gas of 95.0 vol % of nitrogen gas and 5.0 vol % of hydrogen gas, and the gas was sprayed onto the tip of the wire at a gas flow rate of 5.0 L/min. Substantially the center of the formed free air ball on the tip side (the side opposite to a wire neck portion) was analyzed in the depth direction by a scanning Auger electron spectroscopy analyzer (JAMP-9500F (device name) manufactured by JEOL Ltd.). The setting conditions of the Auger electron spectroscopy analyzer are as follows: an acceleration voltage of a primary electron beam of 10 kV, a current of 50 nA, a beam diameter of 5 μm, an acceleration voltage of argon ion sputtering of 1 kV, and a sputtering rate of 2.5 nm/min (in terms of $SiO_2$). The average concentration of palladium relative to the total of copper and palladium was found by analyzing nine or more points at equal intervals from the surface of the tip portion of the free air ball to 5.0-100.0 nm in the depth direction. Concrete analysis points are 31 points every 1.0 nm from the surface to about 30.0 nm, 5 points every 6 nm from 31.0-60.0 nm, and 35 points every 12.0 nm from 61.0-480.0 nm.

Figure 3:
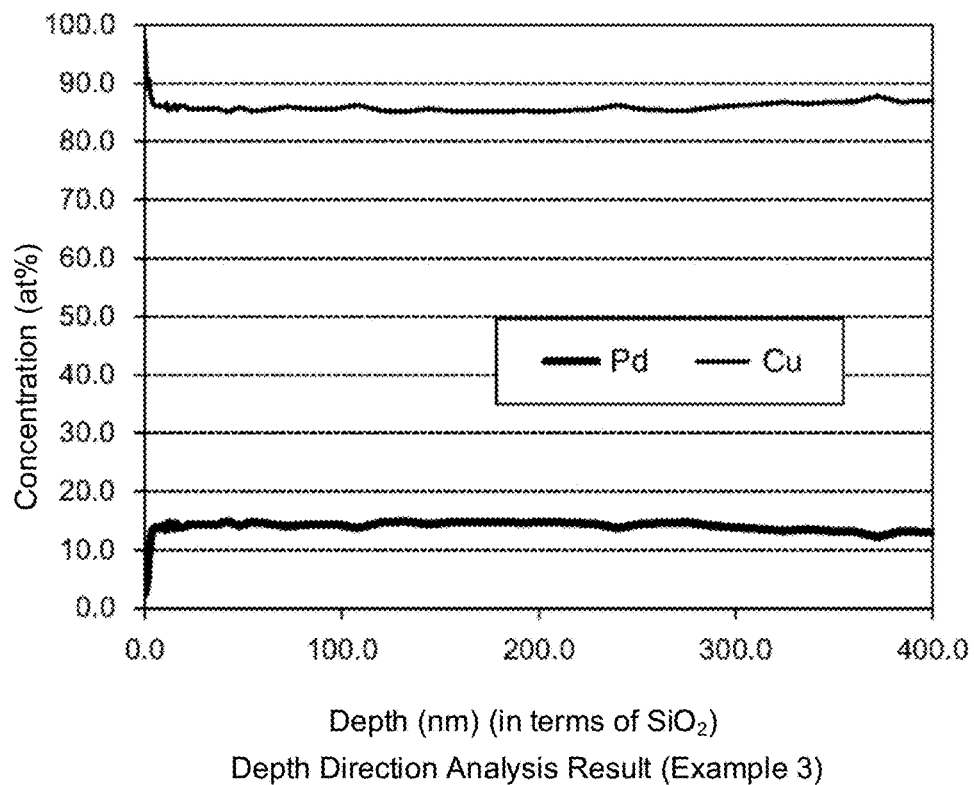
FIG. 3 is an Auger (FE-AES) analysis profile of a surface of a tip portion of the solidified free air ball in the example.

In Examples 2 to 32, with the palladium-coated copper bonding wire obtained above, a free air ball was formed by using the same fully automatic Cu wire bonder as above so as to obtain a predetermined diameter of the ball in a range of 1.5-2.3 times the diameter of the wire under the same conditions as in Example 1 except that the Electronic Flame-Off (EFO) current was adjusted to a predetermined value in a range of 30-90 mA and the discharge time was adjusted to a predetermined value in a range of 50-1000 μs. In Example 10 and Example 31, a copper core material containing 1.3 mass ppm of palladium relative to the entire core material was used. In each of the obtained free air balls in the examples, the average concentration of palladium from the surface of the tip portion of the ball to 5.0-100.0 nm in the depth direction was found as in Example 1. Results are illustrated in Tables 1, 2 along with the composition of the wire and the free air ball forming conditions. Further, an Auger analysis profile of the free air ball in Example 5 from the tip portion in the depth direction is illustrated in FIG. 3. Incidentally, in Examples 2 to 31, the average concentration of palladium from the surface of the tip portion of the ball to 5.0-100.0 nm in the depth direction was found, but even if the average concentration of palladium is in a range of 5.0-400.0 nm, the concentration is equivalent to the values in the table below.

(Shrinkage Cavity Evaluation)

Figure 2:
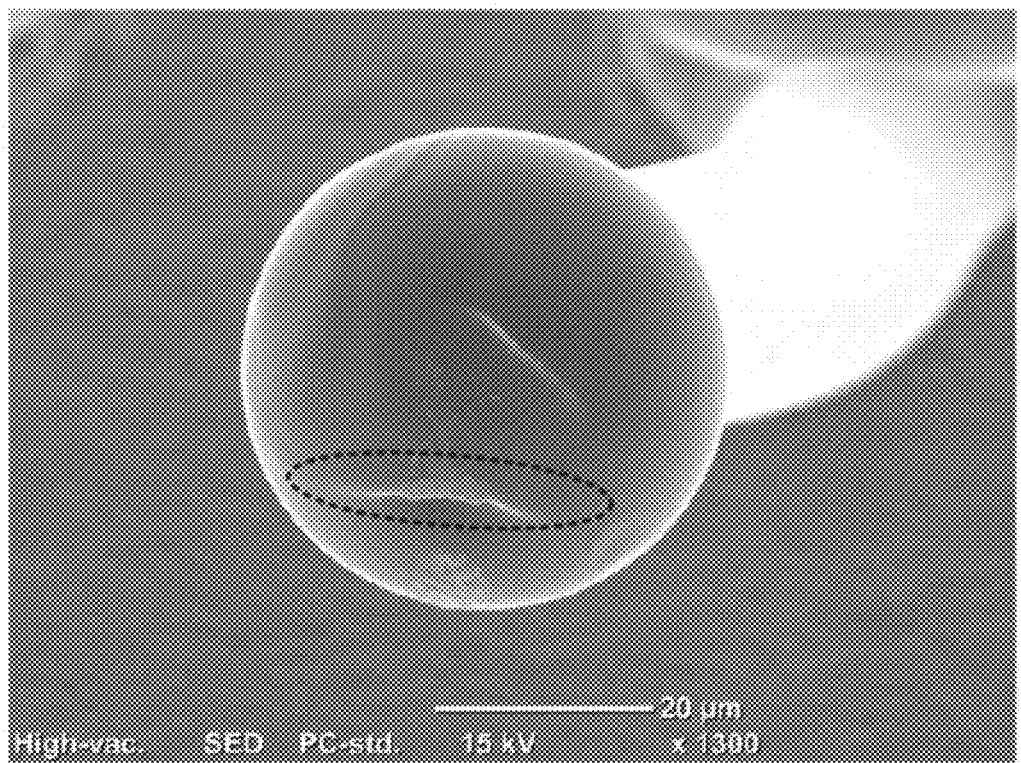
FIG. 2 is a photograph of a solidified free air ball having a large shrinkage cavity observed in a comparative example.

Further, 30 free air balls formed under the same conditions as above were observed with an SEM for the presence or absence of a large shrinkage cavity in the surface of the ball. In SEM observation photographs, a shrinkage cavity with a maximum length of greater than 12 μm was evaluated as a problematic shrinkage cavity, and a shrinkage cavity with a maximum length of 12 μm or less was evaluated as an unproblematic shrinkage cavity. Incidentally, FIG. 1 illustrates a free air ball with an unproblematic small shrinkage cavity, FIG. 2 illustrates a free air ball with a problematic large shrinkage cavity, and the shrinkage cavities are each circled and indicated by a broken line in a photograph. The problematic large shrinkage cavity is a large wrinkle-like groove formed in the surface of the free air ball, as illustrated in FIG. 2. Those with no shrinkage cavity and those with an unproblematic small shrinkage cavity were evaluated as having no shrinkage cavity (G), and those with at least one problematic shrinkage cavity were evaluated as having a shrinkage cavity (P).

(Fabrication of Test Pieces for HAST and HTS)

With the palladium-coated copper bonding wire obtained in each of the examples, free air balls were each formed on Al-1.0 mass % Si-0.5 mass % Cu alloy electrodes having a thickness of 2 μm on a 400-μm thick Si chip on a BGA (ball grid array) substrate by the same fully automatic bonder as above under the same conditions as those for forming the above-described free air ball, and 1000 wires were bonded with a crimp diameter of 50 μm and a loop length of 2 mm. Here, only bonding portions adjacent to each other of the Al-1.0 mass % Si-0.5 mass % Cu alloy electrodes on the chip were electrically connected, the two wires adjacent to each other electrically form one circuit, and 500 circuits in total were formed. Thereafter, the Si chip on the BGA substrate was encapsulated in resin by using a commercially available transfer molding machine (GPGP-PRO-LAB80 manufactured by Dai-ichi Seiko Co., Ltd.) to fabricate a test piece.

<HAST (Highly Accelerated Temperature and Humidity Stress Test)>

This test piece was held by using a HAST device (PCR8D manufactured by HIRAYAMA Manufacturing Corporation) at 130° C.×85.0% RH (relative humidity) for 400 hours and 600 hours. Before and after the holding, electrical resistance values of the 500 circuits described above were measured for each time period, and the case with at least one circuit in which the electrical resistance value after the holding exceeded 1.1 times the electrical resistance value before the holding was evaluated as defective (P) and the case where in all the 500 circuits, the resistance values were less than 1.1 times the resistance value was evaluated as excellent (E). Incidentally, as the resin used for the encapsulation, a commercially available non-halogen-free resin was used. After the 400-hour holding, the electrical resistance values were less than 1.1 times the resistance value in all the samples.

<HTS (High Temperature Storage Test)>

Further, the test piece was held by using a HTS device (DRS420DA manufactured by ADVANTEC CO., LTD.) at 220° C. for 2000 hours. Before and after the holding, electrical resistance values of the 500 circuits were measured similarly to the above, and the case with at least one circuit where the electrical resistance value after the holding exceeded 1.1 times the electrical resistance value before the holding was evaluated as defective (P) and the case where in all the 500 circuits, the resistance values were less than 1.1 times the resistance value was evaluated as excellent (E). Incidentally, as the resin used for the encapsulation, a commercially available non-halogen-free resin was used. Evaluation results of the HAST test and the HTS test are illustrated in Tables 1, 2. The "number of defects" in Table 2 is the number of circuits with the electrical resistance value after the holding exceeding 1.1 times the electrical resistance value before the holding.

TABLE 1

| | | Pd-coated Cu bonding wire | | | | | | | | | |
|---|---|---|---|---|---|---|---|---|---|---|---|
| | | | Concentration of sulfur group element in entire wire | Free air ball | | | Evaluation | | | | |
| | Diameter of wire | Concentration of Pd (derived from Pd layer) in entire wire | | Arc discharge current | Diameter of ball | Concentration of Pd of surface | Crack in wire surface | Shrinkage cavity eval-uation | HAST | | HTS |
| Example | (µm) | (mass %) | S  Se  Te (mass ppm) | value (mA) | (µm) | (atom %) | | | 400 hrs | 600 hrs | |
| Example 1 | 18 | 1.2 | 7  —  — | 65 | 33 | 6.7 | G | G | E | E | E |
| 2 | 18 | 1.2 | 7  —  — | 30 | 30 | 6.8 | G | G | E | E | E |
| 3 | 18 | 1.2 | 7  —  — | 90 | 36 | 6.6 | G | G | E | E | E |
| 4 | 18 | 1.5 | —  8  — | 65 | 27 | 7.2 | G | G | E | E | E |
| 5 | 25 | 1.5 | —  8  — | 90 | 40 | 6.8 | G | G | E | E | E |
| 6 | 25 | 1.5 | —  8  — | 65 | 45 | 7.0 | G | G | E | E | E |
| 7 | 18 | 2.0 | —  —  18 | 65 | 38 | 12.0 | G | G | E | E | E |
| 8 | 25 | 2.0 | —  —  19 | 30 | 50 | 9.7 | G | G | E | E | E |
| 9 | 18 | 2.3 | 11  —  — | 65 | 34 | 20.0 | G | G | E | E | E |
| 10 | 25 | (*)3.6 (2.3) | 11  —  — | 30 | 45 | 15.3 | G | G | E | E | E |
| 11 | 18 | 1.3 | —  18  — | 65 | 37 | 11.0 | G | G | E | E | E |
| 12 | 18 | 1.3 | —  18  — | 30 | 30 | 13.4 | G | G | E | E | E |
| 13 | 18 | 1.6 | —  —  48 | 65 | 28 | 13.0 | G | G | E | E | E |
| 14 | 18 | 1.6 | —  —  48 | 90 | 25 | 14.0 | G | G | E | E | E |
| 15 | 18 | 2.1 | 7  6  — | 65 | 32 | 16.0 | G | G | E | E | E |
| 16 | 18 | 2.1 | 7  6  — | 90 | 34 | 16.5 | G | G | E | E | E |
| 17 | 18 | 2.2 | —  13  24 | 65 | 36 | 23.0 | G | G | E | E | E |
| 18 | 25 | 2.2 | —  13  24 | 30 | 42 | 26.5 | G | G | E | E | E |
| 19 | 18 | 2.4 | 6  7  15 | 65 | 29 | 28.0 | G | G | E | E | E |

*A copper wire rod containing 1.3 mass % of Pd was used for a copper core material.

TABLE 2

| | | | Pd-coated Cu bonding wire | | | | | | | | | |
|---|---|---|---|---|---|---|---|---|---|---|---|---|
| | | | Concentration of sulfur group element in entire wire | Free air ball | | | Evaluation | | | | | |
| | | Diameter of wire | Concentration of Pd (derived from Pd layer) in entire wire | | Arc discharge current | Diameter of ball | Concentration of Pd of surface | Crack in wire surface | Shrinkage cavity eval-uation | HAST | | HTS | Overall eval-uation |
| Example | | (µm) | (mass %) | S  Se  Te (mass ppm) | value (mA) | (µm) | (atom %) | | | 400 hrs | 600 hrs | | |
| Comparative Example | 20 | 18 | 1.9 | —  —  55 | 65 | 33 | — | P | — | — | — | — | P |
| | 21 | 18 | 2.2 | —  28  — | 65 | 36 | — | P | — | — | — | — | P |
| | 22 | 25 | 2.2 | —  28  — | 30 | 44 | — | P | — | — | — | — | P |
| | 23 | 18 | 2.0 | 15  —  — | 65 | 32 | — | P | — | — | — | — | P |
| | 24 | 18 | 1.3 | —  —  12 | 65 | 28 | 5.5 | G | G | G | P(4) | P(6) | P |
| | 25 | 18 | 1.3 | —  —  12 | 90 | 34 | 5.3 | G | G | G | P(6) | P(6) | P |
| | 26 | 18 | 1.6 | —  —  10 | 65 | 37 | 5.2 | G | G | G | P(3) | P(5) | P |

TABLE 2-continued

| | | Pd-coated Cu bonding wire | | | | | | | | | | | |
|---|---|---|---|---|---|---|---|---|---|---|---|---|---|
| | | Concentration of Pd (derived from Pd layer) in entire wire | Concentration of sulfur group element in entire wire (mass ppm) | | | Free air ball | | | Evaluation | | | | |
| | Diameter of wire | | | | | Arc discharge current | Diameter of ball | Concentration of Pd of surface | Crack in wire | Shrinkage cavity eval- | HAST | | |
| Example | (μm) | (mass %) | S | Se | Te | (mA) | value | (μm) | (atom %) | surface | uation | 400 hrs | 600 hrs | HTS | Overall evaluation |
| 27 | 25 | 1.6 | — | — | 10 | 65 | 47 | 5.0 | G | G | G | P(5) | P(8) | P |
| 28 | 18 | 1.6 | 2 | 3 | 3 | 65 | 29 | 4.5 | G | G | G | P(8) | P(10) | P |
| 29 | 18 | 0.8 | 6 | 18 | — | 65 | 35 | 3.0 | G | G | G | P(7) | P(12) | P |
| 30 | 18 | 2.8 | — | 10 | 26 | 65 | 30 | 32.0 | G | P | G | P(18) | P(22) | P |
| 31 | 18 | (*)4.1 (2.8) | — | 10 | 26 | 65 | 32 | 38.6 | G | P | G | P(16) | P(21) | P |
| 32 | 18 | 3.5 | 10 | — | — | 65 | 33 | 36.0 | G | P | G | P(24) | P(30) | P |

*A copper wire rod containing 1.3 mass % of Pd was used for a copper core material.

Tables 1, 2 reveal that according to the palladium-coated copper bonding wire having 1.0-4.0 mass % of the concentration of palladium in the entire wire, containing sulfur, selenium, and tellurium with concentrations in predetermined ranges, and including the palladium-concentrated region containing 6.5-30.0 atom % or less of palladium on average on the surface of the solidified free air ball, the reliability in the HAST and the HTS was improved while suppressing the occurrence of a shrinkage cavity as compared to the palladium-coated copper bonding wire in the comparative example having no palladium-concentrated region.

For example, in the above-described device for automobile use, the biggest problem is the bonding life of the ball bonding portion (first bonding) where the free air ball and the electrode are bonded in particular. The device for automobile use is required to meet the condition that the resistance value of the semiconductor device, where the aluminum electrode and the ball are bonded to be resin-encapsulated, after the exposure for 200 hours or more in the HAST needs to be suppressed to an increase of 1.1 times or less the resistance value before the exposure. It is the halogen elements such as chlorine and the moisture, which are contained in the resin used for the encapsulation to be performed after ball bonding, that adversely affect the bonding life, namely, the increase in resistance value. These chlorine and moisture corrode the intermetallic compound generated in the ball bonding portion, causing the resistance value of the bonding portion to increase. The increase in resistance value causes poor current flow and interferes with the transmission of electrical signals, and in the case of automotive applications, the increase in resistance value may lead to automobile accidents, resulting in a serious problem. In the palladium-coated copper bonding wires in the above-described examples, the results of the HAST test are all good even after 600-hour exposure, thus indicating that the bonding reliability is high and such a serious problem as above is not caused even when they are used for the devices for automobile use.

Examples 33 to 35

Next, the properties of a palladium-coated copper bonding wire including a gold layer on the palladium layer were confirmed. Palladium-coated copper bonding wires each having a gold layer were fabricated in the same manner as in Examples 1, 4, and 7, except that after coating with palladium, gold plating was further applied using a commercially available gold plating bath in the manufacturing process of the palladium-coated copper bonding wires in Examples 1, 4, and 7 (Examples 33 to 35). Incidentally, the concentration of each element in Table 3 was calculated without including the concentration of gold of the gold layer in the entire wire.

The palladium-coated copper bonding wires each including the gold layer and the palladium-coated copper bonding wires in Examples 1, 4, and 7 each including no gold layer were subjected to a die wear test, and results are illustrated in the column of "Die wear" in Table 3. In the die wear test, the wire of each sample was drawn to 50,000 m with a final diameter of 18 μm from the diameter of the wire after gold plating by performing continuous wire drawing through a plurality of dies. The wear of the die before and after the wire drawing was evaluated as follows: those in which the inside diameter of the die at the final wire diameter of 18 μm was increased in size by less than 0.1 μm as compared to that before working were evaluated as very good (E), and those in which the inside diameter of the die was increased in size by 0.1 μm or more and less than 0.2 μm were evaluated as good (G).

Further, a pull strength was measured on the palladium-coated copper bonding wire including the gold layer and the palladium-coated copper wire including no gold layer in order to make a comparison of a bonding strength of the second bonding. In a pull strength bondability test of the second bonding, the same bonder apparatus manufactured by K and S Co., Ltd. as above was used, wire bonding was performed with a loop length of 2 mm and a loop height of 200 μm, and the position on the first bonding side at 20.0% of the wire bonding length from the second bonding point was evaluated by a breaking strength obtained when a tensile test was performed with a predetermined pull hook. Results are illustrated in the column of "2nd pull strength" in Table 3, and the case with a breaking strength of 4.0 gf or more was evaluated as excellent (E) and the case with a breaking strength of 3.5 gf or more and less than 4.0 gf was evaluated as good (G). Further, the thickness of the gold layer in Table 3 is the value found by calculating the mass of gold per unit length from the concentration of gold and the specific gravity of gold, and assuming that the wire having a unit length has a perfectly circular cross section and gold is uniformly present on the top surface of the wire having a unit length.

Further, in the respective examples, the shrinkage cavity, the HAST, and the HTS were evaluated as in Example 1. As illustrated in Table 3, the evaluations of the shrinkage cavity, the HAST, and the HTS in the palladium-coated copper bonding wire including the gold layer were as good as those of the palladium-coated copper bonding wire including no gold layer. This is thought to be because the amount of gold derived from the gold layer was very small as compared to the gold to adhere during the second bonding, and because gold covered the entire wire and did not flocculate locally, and thus no shrinkage cavity occurred.

that the width (depth) of the region with the palladium ratio of 5.0 mass % or more detected near the bonding surface with 0 mass % or more and 100 mass % or less of aluminum relative to the total of aluminum, copper, and palladium was about 1.24 μm on average of the two points. Further, the test to confirm the palladium-concentrated bonding region was performed similarly in Examples 1 to 19 and Examples 32 to 34, and then, in each case, a region with the palladium ratio of 5.0 mass % or more, which had a width of 0.50 μm or more, was detected near the bonding surface with 0 mass % or more and 100 mass % or less of aluminum relative to the total of aluminum, copper, and palladium.

Next, the palladium-coated copper bonding wire in a predetermined example was evaluated for chip damage and the HAST test, in which the set temperature was increased by 5° ° C. to set severe specifications at 135° C. for 600

TABLE 3

| Example | Gold layer (thickness) | Concentration relative to total of Cu, Pd, and sulfur group element | | | | Concentration of Pd of surface of FAB (atom %) | Evaluation | | | | |
|---|---|---|---|---|---|---|---|---|---|---|---|
| | | Pd (mass %) | S (mass %) | Se (mass %) | Te (mass %) | | Die wear | 2nd pull strength | Shrinkage cavity | HAST | HTS |
| Example 33 | 2 nm | 1.2 | 7 | — | — | 6.7 | E | E | G | E | E |
| 34 | 4 nm | 1.5 | — | 8 | — | 7.2 | E | E | G | E | E |
| 35 | 6 nm | 2.0 | — | — | 18 | 12.0 | E | E | G | E | E |
| 1 | None | 1.2 | 7 | — | — | 6.7 | G | G | G | E | E |
| 4 | None | 1.5 | — | 8 | — | 7.2 | G | G | G | E | E |
| 7 | None | 2.0 | — | — | 18 | 12.0 | G | G | G | E | E |

(Analysis of a Bonding Structure of a Wire)

Figure 4:
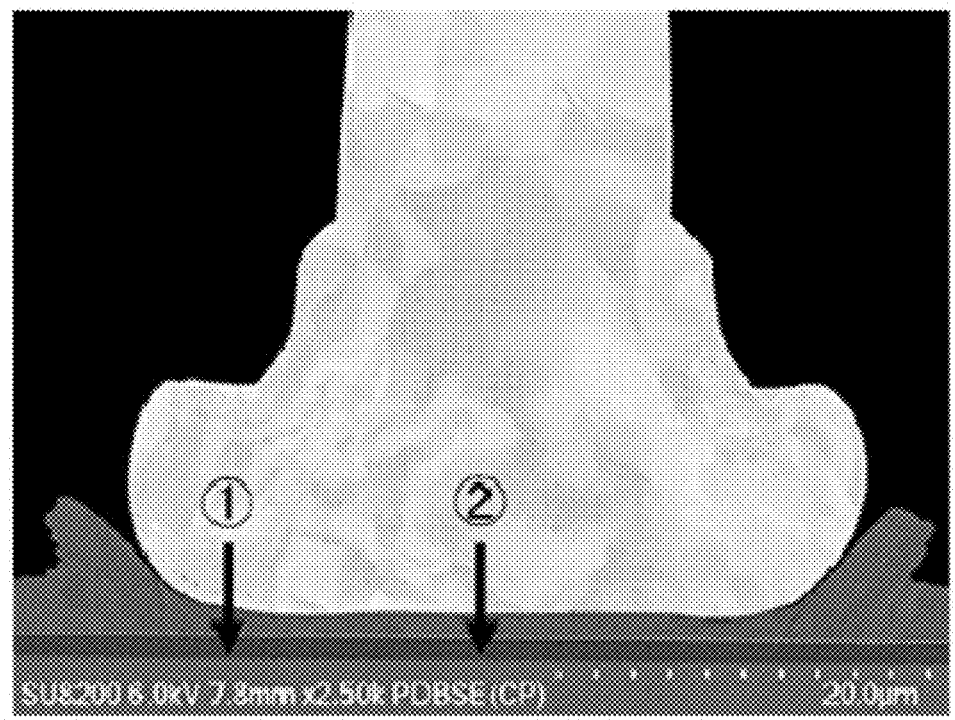
FIG. 4 is a photograph illustrating analysis points of a bonding structure in the example.
Figure 5:
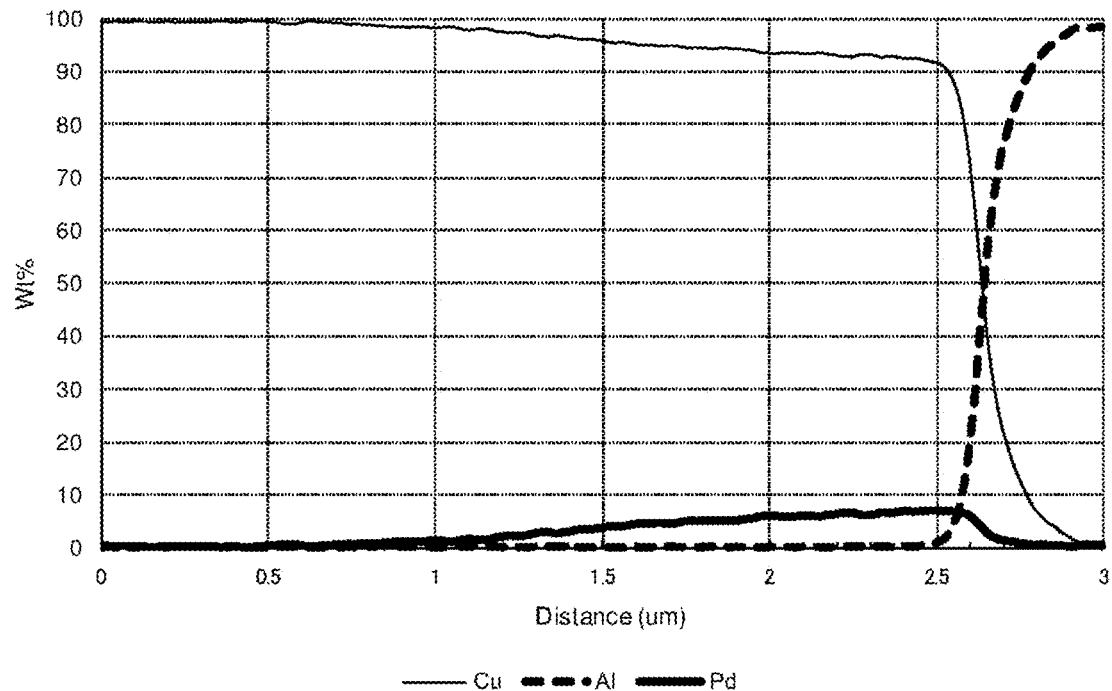
FIG. 5 is a scanning electron microscopy/energy dispersive X-ray spectrometry (SEM-EDX) profile of the bonding structure in the example.
Figure 6:
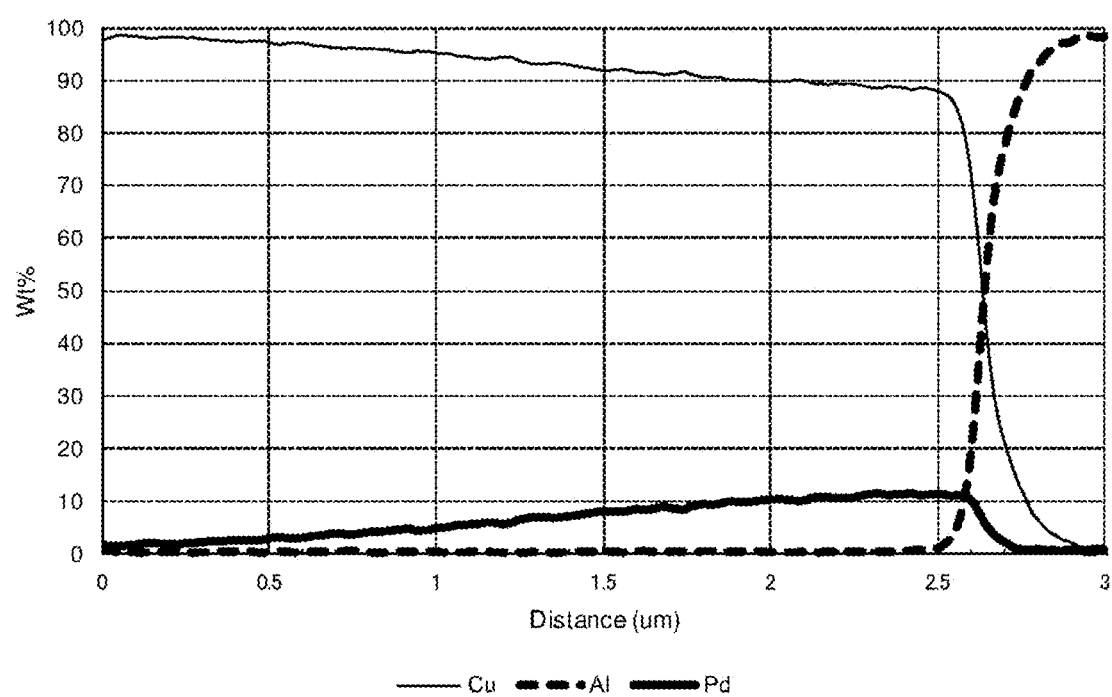
FIG. 6 is an SEM-EDX profile of another point of the bonding structure in the example.

In Example 1, the palladium-coated copper bonding wire fabricated in the same manner as in Example 1, except that the concentration of palladium was set to 1.7 mass % and the concentration of sulfur was set to 8 mass ppm was used to form a ball bonding on the aluminum electrode under the same free air ball forming conditions as those in Example 1. An obtained ball bonding portion was cut so as to make a surface parallel to the center line in the longitudinal direction of the wire exposed. A cut surface was line-analyzed by scanning electron microscopy/energy dispersive X-ray spectrometry (SEM-EDX) from a predetermined point on the wire side in a direction substantially vertical to the bonding surface. The analysis conditions are as follows: an acceleration voltage of 6 keV, a measurement region ¢ of 0.18 μm, and a measurement interval of 0.02 μm as the setting of the SEM-EDX. This measurement was performed at two points of the bonding portion as illustrated in FIG. 4. Obtained SEM-EDX profiles are illustrated in FIG. 5 and FIG. 6. Incidentally, FIG. 5 illustrates the analysis result of a measurement point 1 in FIG. 4, and FIG. 6 illustrates the analysis result of a measurement point 2. FIG. 5 and FIG. 6 reveal hours. Chip damage performance was evaluated by performing ball bonding using the palladium-coated copper bonding wire obtained in each of the examples under the same conditions as above, and observing the substrate directly under the ball bonding portion with an optical microscope. One hundred bonding portions were observed. Example 19 was marked as good (G) because there was one small crack that did not cause any particular problem in use. The other examples were marked as excellent (E) because no cracks occurred at all. In the HAST test with severe specifications, as in the normal HAST test, the example in which the electrical resistance value after the test was less than 1.1 times the value before the test was evaluated as E, and the example in which the electrical resistance value after the test was 1.1 times or more and 1.2 times or less the value before the test was evaluated as G. Incidentally, in Example 1, in five of the 500 circuits, the electrical resistance value after the test was 1.1 times or more and 1.2 times or less the value before the test, but in the other circuits, the electrical resistance value after the test was less than 1.1 times the value before the test. Further, as an overall evaluation, the example in which the result of the chip damage evaluation and the result of the HAST test with severe specifications are both E was evaluated as E, and the example in which one of them is G and the other of them is E was evaluated as G. The results are illustrated in Table 4.

TABLE 4

| | | Pd-coated Cu bonding wire | | | | | | |
|---|---|---|---|---|---|---|---|---|
| | | Concentration of Pd in entire wire | Concentration of sulfur group element in entire wire (mass ppm) | | | Concentration of Pd of surface of FAB | Evaluation | | |
| Example | | (mass %) | S | Se | Te | (atom %) | Chip damage | HAST (severe specifications) | Overall evaluation |
| Example | 1 | 1.2 | 7 | — | — | 6.7 | E | G | G |
| | 4 | 1.5 | — | 8 | — | 7.2 | E | E | E |
| | 7 | 2.0 | — | — | 18 | 12.0 | E | E | E |
| | 9 | 2.3 | 11 | — | — | 20.0 | E | E | E |
| | 11 | 1.3 | — | 18 | — | 11.0 | E | E | E |
| | 13 | 1.6 | — | — | 48 | 13.0 | E | E | E |
| | 15 | 2.1 | 7 | 6 | — | 16.0 | E | E | E |
| | 17 | 2.2 | — | 13 | 24 | 23.0 | E | E | E |
| | 19 | 2.4 | 6 | 7 | 15 | 28.0 | G | E | G |

Table 4 reveals that Examples 1 to 9 where the concentration of palladium of the surface of the tip portion of the free air ball (palladium-concentrated region) was 7.0 atom % or more were able to withstand even the HAST test performed under the conditions more severe than usual, where the temperature was set to 135° C. It reveals that in Example 1 where the concentration of palladium of the surface of the tip portion of the free air ball was 6.7 atom %, some of the resistance values were 1.1 times or more and 1.2 times or less after the test, which was slightly inferior to the examples where the concentration of palladium of the palladium-concentrated region was 7.0 atom % or more. Further, in the examples where the concentration of palladium of the surface of the tip portion of the free air ball was 25.0 atom % or less, no chip damage occurred, while in Example 19 where the concentration was greater than 25.0 atom %, a small amount of chip damage occurred, which did not cause any problem. These reveal that the concentration of palladium of the surface of the free air ball is preferably 7.0 atom % or more and 25.0 atom % or less. The palladium-coated copper bonding wire where the concentration of palladium of the surface of the free air ball is 7.0 atom % or more and 25.0 atom % or less is suitable for devices for automobile use and also enables an improvement in yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A palladium-coated copper bonding wire containing 50 mass ppm or less of sulfur group element in total, the palladium-coated copper bonding wire comprising:
   a core material containing copper as a main component; and
   a palladium layer on the core material, wherein
   the sulfur group element includes at least one of:
      5 mass ppm or more and 12 mass ppm or less of sulfur (S);
      5 mass ppm or more and 20 mass ppm or less of selenium (Se); and
      15 mass ppm or more and 50 mass ppm or less of tellurium (Te),
   a concentration of palladium is 1.0 mass % or more and 4.0 mass % or less relative to the total of copper, palladium, and the sulfur group element of the palladium-coated copper bonding wire, and
   a palladium-concentrated region in a free air ball formed at a tip of the palladium-coated copper bonding wire that has an average concentration of palladium of 6.5 atom % or more and 30.0 atom % or less relative to the total of copper and palladium that is within a range from a surface of a tip portion of the free air ball to 5.0 nm or more and 100.0 nm or less.

2. The palladium-coated copper bonding wire according to claim 1, wherein
   a concentration of palladium derived from the palladium layer is 1.0 mass % or more and 2.5 mass % or less relative to the total of copper, palladium, and the sulfur group element of the palladium-coated copper bonding wire.

3. The palladium-coated copper bonding wire according to claim 1, wherein a diameter of the palladium-coated copper bonding wire is 10 μm or more and 30 μm or less.

4. The palladium-coated copper bonding wire according to claim 1, wherein free air ball forming conditions when detecting the palladium-concentrated region are that a discharge current value is 65 mA and a diameter of the ball is 1.8 times the diameter of the wire, in the presence of a mixed gas of nitrogen and hydrogen.

5. The palladium-coated copper bonding wire according to claim 1, wherein
   the concentration of palladium of the palladium-concentrated region is a concentration measured under Auger electron spectroscopy analysis conditions where an acceleration voltage of a primary electron beam is 10 kV, a measurement region calculated from a set value is 15 μm² or more and 20 μm² or less, an acceleration voltage of argon ion sputtering is 1 kV, and a sputtering rate is 2.5 nm/min (in terms of $SiO_2$) as setting conditions of a device.

6. The palladium-coated copper bonding wire according to claim 1, wherein 50.0% or more of the sulfur group element is contained in the palladium layer.

7. The palladium-coated copper bonding wire according to claim 1, wherein
50.0% or more of the sulfur group element is contained between a surface of the palladium-coated copper bonding wire and a place with 50.0 atom % of palladium relative to the total of palladium and copper.

8. The palladium-coated copper bonding wire according to claim 1, further comprising:
a gold layer on a surface of the palladium layer.

9. The palladium-coated copper bonding wire according to claim 1, wherein
a concentration of sulfur (S) in the entire palladium-coated copper bonding wire is 6 mass ppm or more and 10 mass ppm or less.

10. The palladium-coated copper bonding wire according to claim 1, wherein
a concentration of selenium (Se) in the entire palladium-coated copper bonding wire is 6 mass ppm or more and 15 mass ppm or less.

11. The palladium-coated copper bonding wire according to claim 1, wherein
a concentration of tellurium (Te) in the entire palladium-coated copper bonding wire is 16 mass ppm or more and 45 mass ppm or less.

12. A method of manufacturing a palladium-coated copper bonding wire containing 50 mass ppm or less of sulfur group element in total, the palladium-coated copper bonding wire including: a core material containing copper as a main component; and a palladium layer on the core material, wherein
the sulfur group element includes at least one of:
5 mass ppm or more and 12 mass ppm or less of sulfur (S);
5 mass ppm or more and 20 mass ppm or less of selenium (Se); and
15 mass ppm or more and 50 mass ppm or less of tellurium (Te),
a concentration of palladium is 1.0 mass % or more and 4.0 mass % or less relative to the total of copper, palladium, and the sulfur group element, and
the manufacturing method comprising:
preparing a copper wire rod containing copper as a main component and
forming a palladium layer containing the sulfur group element on a surface of the copper wire rod.

* * * * *